(12) United States Patent
Wagenleitner

(10) Patent No.: US 9,851,645 B2
(45) Date of Patent: Dec. 26, 2017

(54) DEVICE AND METHOD FOR ALIGNING SUBSTRATES

(71) Applicant: EV GROUP E. THALLNER GMBH, St. Florian am Inn (AT)

(72) Inventor: Thomas Wagenleitner, Aurolzmunster (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 531 days.

(21) Appl. No.: 14/396,995

(22) PCT Filed: Dec. 6, 2013

(86) PCT No.: PCT/EP2013/075831
§ 371 (c)(1),
(2) Date: Oct. 24, 2014

(87) PCT Pub. No.: WO2015/082020
PCT Pub. Date: Jun. 11, 2015

(65) Prior Publication Data
US 2016/0240420 A1   Aug. 18, 2016

(51) Int. Cl.
*G03F 9/00* (2006.01)
*G03F 7/20* (2006.01)
(Continued)

(52) U.S. Cl.
CPC ....... *G03F 9/7088* (2013.01); *G01R 31/2887* (2013.01); *G03F 7/70733* (2013.01);
(Continued)

(58) Field of Classification Search
CPC ............ G03F 7/70716; G03F 7/70725; G03F 7/70733; G03F 9/7003; G03F 9/7011;
(Continued)

(56) References Cited

U.S. PATENT DOCUMENTS 4,573,791 A * 3/1986 Phillips .................... G03F 9/70
355/43
4,597,664 A * 7/1986 Johannsmeier ....... G03F 9/7069
355/43

(Continued)

FOREIGN PATENT DOCUMENTS

CN     103000553 A    3/2013  ............. H01L 21/67
EP      1675165 A2    6/2006  ............. H01L 21/18
(Continued)

OTHER PUBLICATIONS

Office Action issued in corresponding Singapore Application No. 11201406979V, dated Nov. 2, 2015.
(Continued)

*Primary Examiner* — Crystal J Barnes-Bullock
(74) *Attorney, Agent, or Firm* — Kusner & Jaffe

(57) ABSTRACT

A method for aligning and bringing a first substrate into contact with a second substrate as well as a corresponding device with at least four detection units wherein:
  at least two first detection units can move at least in the X-direction and in the Y-direction, and
  at least two second detection units can move exclusively in the Z-direction.

14 Claims, 10 Drawing Sheets

Figure 2A:
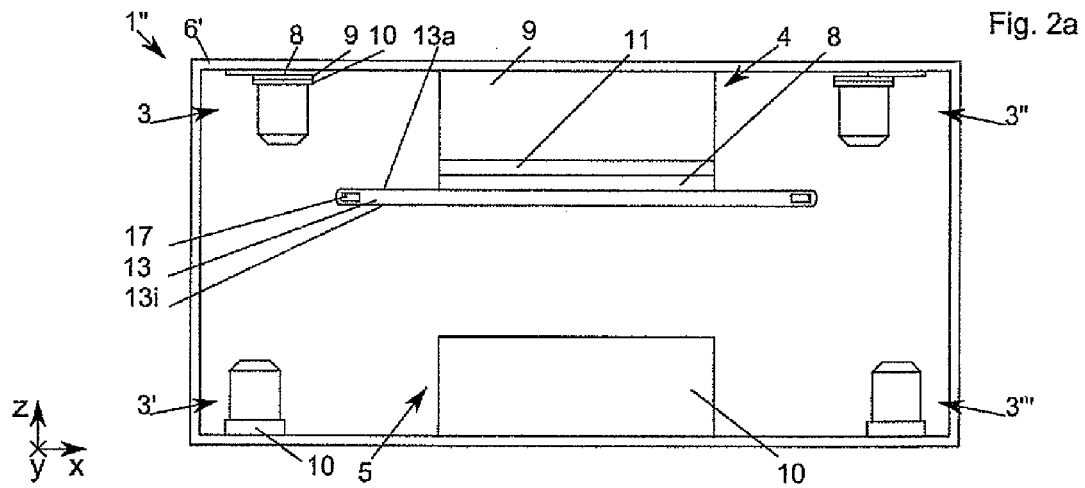

(51) Int. Cl.
*G01R 31/28* (2006.01)
*H01L 21/67* (2006.01)
*H01L 21/68* (2006.01)
*H01L 21/683* (2006.01)
*H01L 21/66* (2006.01)

(52) U.S. Cl.
CPC .......... *G03F 9/7011* (2013.01); *G03F 9/7023* (2013.01); *H01L 21/67092* (2013.01); *H01L 21/681* (2013.01); *H01L 21/6838* (2013.01); *H01L 22/26* (2013.01)

(58) Field of Classification Search
CPC .... G03F 9/7023; G03F 9/7069; G03F 9/7088; G01R 31/2887; G01R 31/2891; G01R 31/2893; H01L 21/68; H01L 21/681
See application file for complete search history.

(56) References Cited

U.S. PATENT DOCUMENTS

| | | | | |
|---|---|---|---|---|
| 4,810,941 | A * | 3/1989 | Ohishi | G05B 19/232 318/592 |
| 5,177,528 | A | 1/1993 | Koromegawa et al. | 355/53 |
| 5,639,323 | A * | 6/1997 | Jordan | G11B 5/105 156/299 |
| 6,774,651 | B1 * | 8/2004 | Hembree | H01L 21/681 324/750.19 |
| 7,009,683 | B2 * | 3/2006 | Sato | G03B 27/42 250/492.2 |
| 7,442,476 | B2 | 10/2008 | Best et al. | 430/22 |
| 8,148,646 | B2 * | 4/2012 | Fan | G01R 3/00 174/261 |
| 8,367,016 | B2 * | 2/2013 | Quan | B01L 3/5025 422/500 |
| 8,454,771 | B2 | 6/2013 | Horikoshi | 156/64 |
| 8,891,056 | B2 * | 11/2014 | Shibazaki | G03F 7/70716 355/53 |
| 8,918,989 | B2 * | 12/2014 | Burggraf | H01L 21/67132 29/721 |
| 8,964,190 | B2 | 2/2015 | Tanaka et al. | 356/620 |
| 9,201,115 | B2 * | 12/2015 | Yamada | G01R 31/2887 |
| 9,223,229 | B2 * | 12/2015 | Wu | G03F 7/70725 |
| 9,299,620 | B2 | 3/2016 | Horikoshi | 23/544 |
| 9,576,825 | B2 * | 2/2017 | Figura | H01L 21/67092 |
| 2006/0141743 | A1 | 6/2006 | Best et al. | 438/455 |
| 2007/0252994 | A1 | 11/2007 | Bijnen et al. | 356/401 |
| 2008/0083818 | A1 | 4/2008 | Best et al. | 228/103 |
| 2009/0123874 | A1 * | 5/2009 | Nagayama | G03F 7/70525 430/311 |
| 2010/0139836 | A1 | 6/2010 | Horikoshi | 156/64 |
| 2010/0231928 | A1 | 9/2010 | Tanaka et al. | 356/620 |
| 2012/0237328 | A1 | 9/2012 | Figura | 414/749.6 |
| 2012/0255365 | A1 | 10/2012 | Wimplinger | 73/760 |
| 2013/0244350 | A1 | 9/2013 | Horikoshi | 438/16 |
| 2014/0132940 | A1 * | 5/2014 | Yoda | G03F 7/70133 355/67 |
| 2015/0138566 | A1 * | 5/2015 | Wagenleitner | H01L 21/681 356/614 |
| 2016/0320697 | A1 * | 11/2016 | Asano | G03F 7/0002 |

FOREIGN PATENT DOCUMENTS

| | | | |
|---|---|---|---|
| JP | 2005-251972 | 9/2005 | ............ H01L 21/02 |
| JP | 2006-186377 | 7/2006 | ............ H01L 25/065 |
| JP | 2008-135708 | 6/2008 | ............ H01L 21/02 |
| JP | 4339849 | 7/2009 | |
| JP | 2011-233683 | 11/2011 | ............ B23K 20/02 |
| JP | 5139604 | 2/2013 | ............ H01L 21/683 |
| KR | 10-2010-0063000 | 6/2010 | ............ H01L 21/02 |
| TW | 201015661 A | 4/2010 | ............ G06F 9/00 |
| WO | WO 2009/022457 | 2/2009 | ............ H01L 21/02 |
| WO | WO 2010/023935 | 3/2010 | ............ H01L 21/02 |
| WO | WO2013076874 A1 | 5/2013 | ............ B65G 49/06 |

OTHER PUBLICATIONS

Office Action issued in corresponding Korean Patent Application No. 10-2016-7022033 dated Aug. 30, 2016.
International Search Report from corresponding International Patent Application No. PCT/EP2013/075831.
Office Action issued in corresponding Japanese Patent Application No. 2015-551148.

* cited by examiner

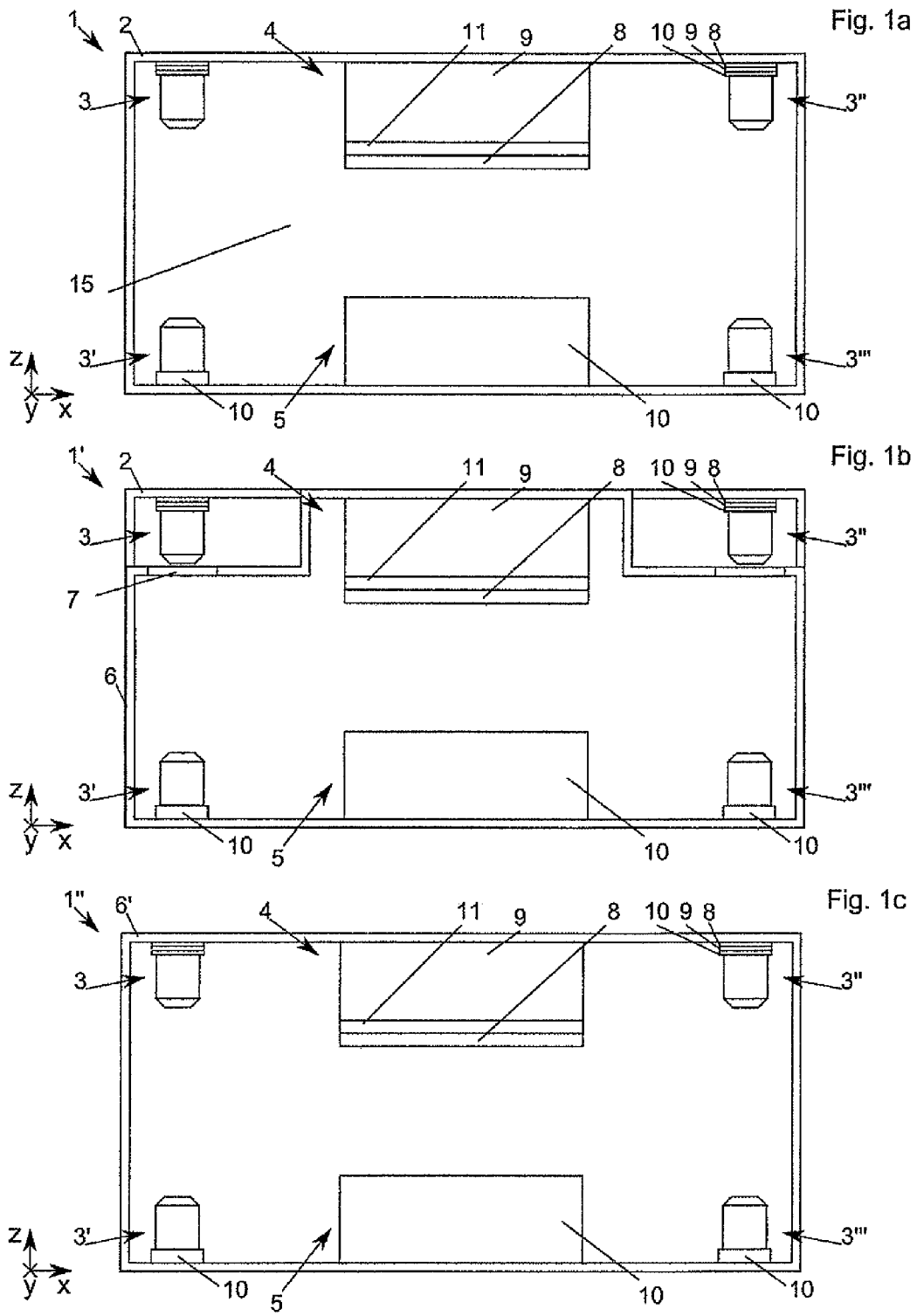

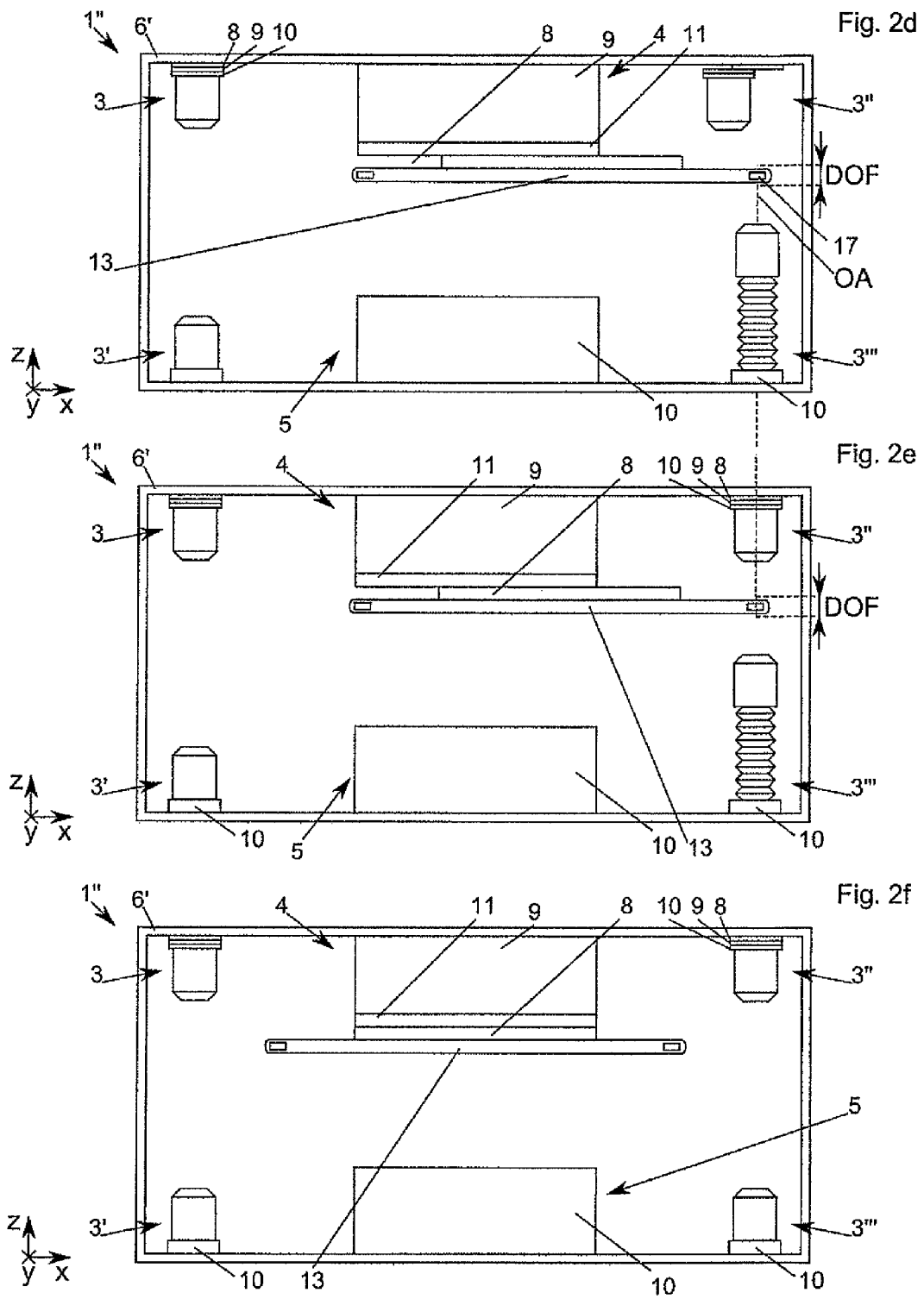

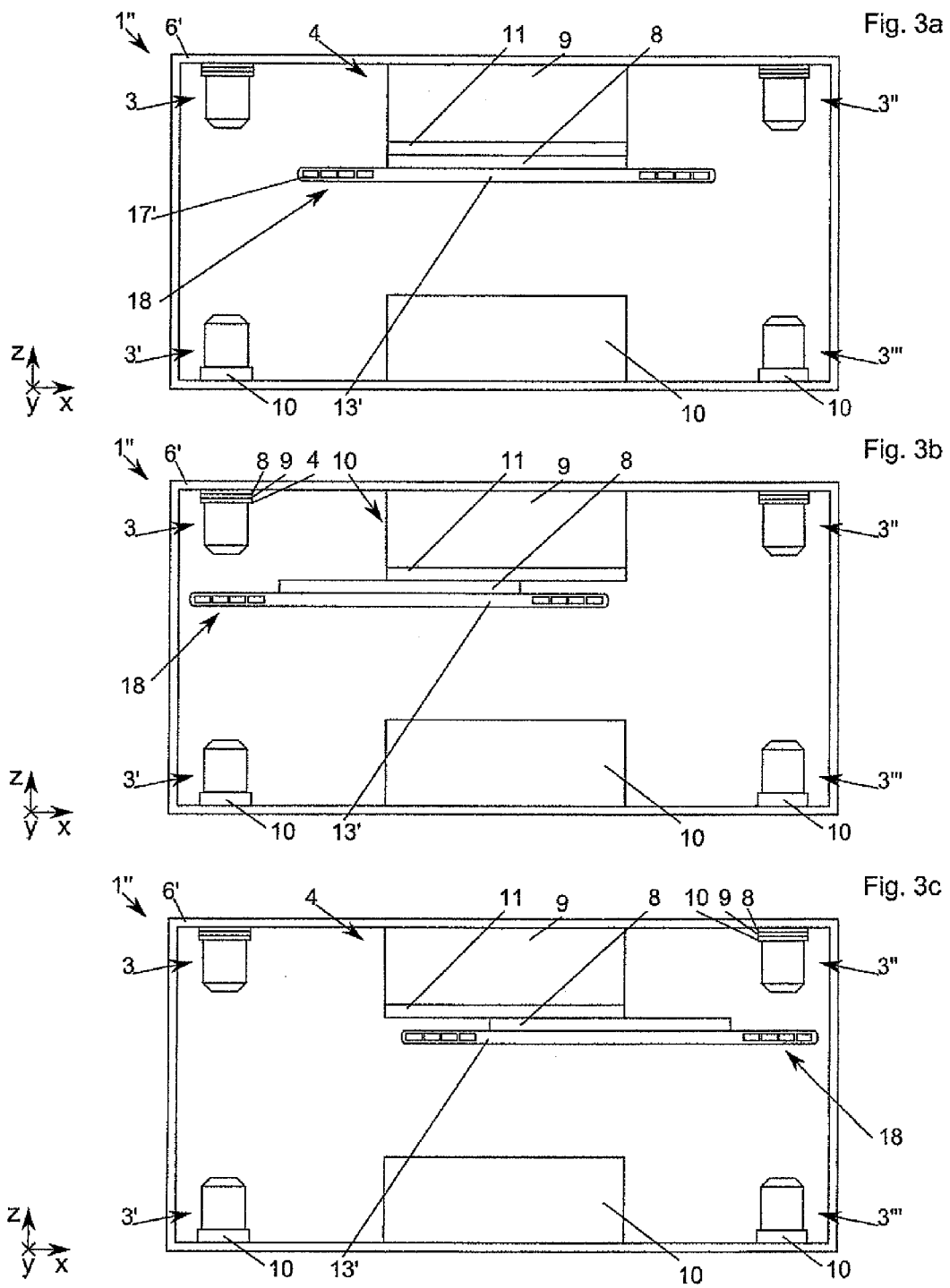

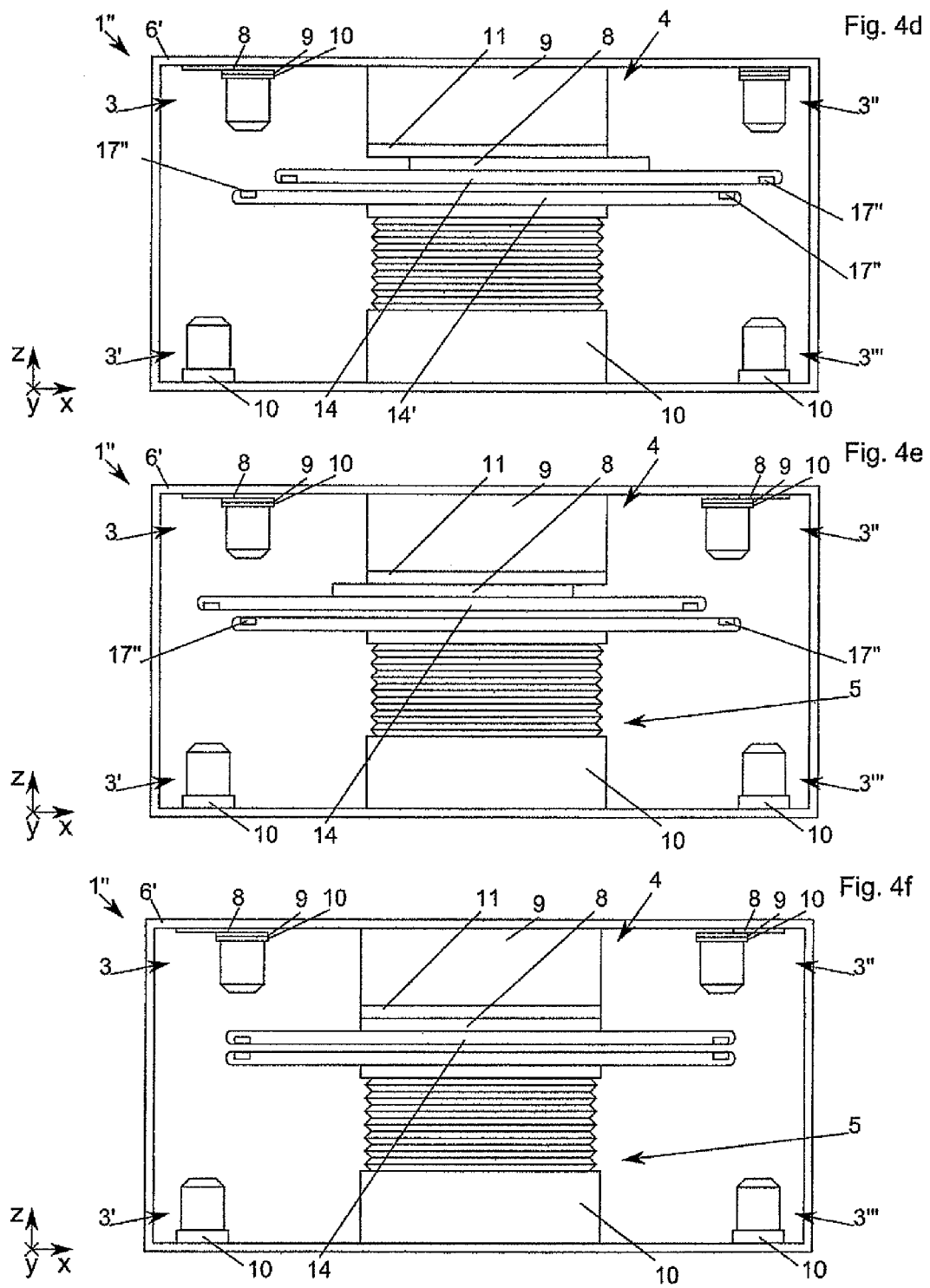

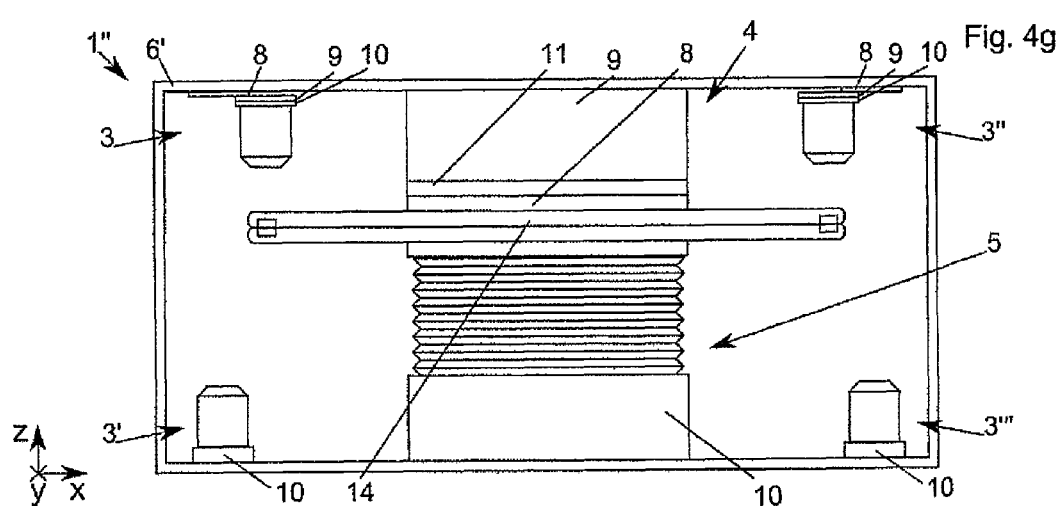

DEVICE AND METHOD FOR ALIGNING SUBSTRATES

FIELD OF THE INVENTION

This invention relates to a method for aligning and bringing a first substrate into contact with a second substrate and a device for performing the same.

BACKGROUND OF THE INVENTION

The miniaturization of electronic circuits, such as, for example, microchips or storage structural units as well as micromechanical components and microfluid components, has been continuously advancing for decades. In order to further increase the density of these functional groups, stacking of such devices was begun some years ago. The functional groups are produced for this purpose on a substrate, for example a wafer. The wafers are then aligned with one another and bonded with one another, which in some few process steps leads to a large yield and primarily functional groups stacked on one another in a high density.

The functional groups of different wafers in most cases also have different functionalities. Thus, the functional groups of a first wafer can be microchips, while the functional groups of the second wafer can be memory chips. Before the actual connecting process, an alignment of the wafers with one another is carried out. The smaller the functional groups on the wafers, the more precise the alignment process of two wafers with one another must be in order to achieve the necessary precision and a correspondingly low scrapping.

The precision with which two wafers can be aligned with one another depends decisively on the optical and the mechanical component parts of the alignment unit, as well as the use thereof.

In the case of the optical component parts, it is primarily to be ensured that the magnification, but especially the resolution, is high enough to detect the alignment marks on the substrates as exactly as possible. In addition, as large as possible a depth of focus area in the case of a correspondingly high magnification and resolution is desirable.

In the case of mechanical components, primarily the motors and the bearings are of decisive importance. The motors must accelerate, move and brake high loads, but in this case they must also allow a positional control that is as precise as possible and primarily reproducible. In order to guarantee this, special types of bearings are necessary. The bearings provide for the storage of the load that is to be shifted is as friction-free as possible. Up until now, air bearings were preferably used, which allowed a non-contact shifting of two components relative to one another.

Primarily in a vacuum environment, it may be advantageous to eliminate as many motors as possible and thus also the necessary storage in order to increase the precision and reproducibility of the remaining motors.

In the state of the art, there already exist alignment systems such as, for example, those disclosed in AT405775B. The latter show, however, some serious drawbacks. In this respect, the traveling distances between the lower and upper specimen holders in the Patent Specification AT405775B are very long, which can lead to a correspondingly inaccurate positioning of the two substrates relative to one another, when the actual joining process is carried out.

In addition, it is desirable to perform the alignment process in a vacuum environment. The use of the above-mentioned air bearings is accordingly difficult and problematic.

Therefore, another alignment system was disclosed in the publication PCT/EP2013/062473. In this publication, the problem of the long traveling distances is solved in that the substrates that are aligned with one another move laterally along the connecting axis of two markings. In contrast to the embodiment in AT405775B, the optics were not applied in front of the substrates but rather laterally thereto, so that the traveling distances can be drastically reduced. By the radical shortening of the traveling distances, the alignment unit in PCT/EP2013/062473 can use completely different motors and bearings that are primarily suitable for the vacuum.

It is therefore the object of this invention to provide a device and a method for aligning and bringing substrates into contact, with which a more precise and more efficient alignment and contacting of substrates, in particular under vacuum, is made possible.

This object is achieved with the features of claims 1 and 8. Advantageous further developments of the invention are indicated in the subclaims. All combinations that consist of at least two of the features indicated in the specification, the claims and/or the figures also fall within the framework of the invention. In the case of the indicated value ranges, values lying within the above-mentioned limits are also disclosed as boundary values and can be claimed in any combination.

SUMMARY OF THE INVENTION

The invention generically involves a device and a method, two substrates, preferably two wafers to be optimally aligned with one another, in particular in a vacuum environment, and making contact between them after alignment is carried out.

In this case, the invention is based in particular on the concept that for the correct alignment of two substrates with one another, only one, in particular a single, specimen holder (first holder for fixing the first substrate) with at least three degrees of freedom is required, while a second specimen holder (second holder for fixing the second substrate) preferably has only a single, highly-precise degree of freedom. Highly precise degree of freedom is defined as the motor for controlling the specimen holder being able to position the specimen holder in a correspondingly precise manner. In addition, the embodiment according to the invention provides at least two detection units, which have only a single degree of freedom, in particular in a Z-direction.

The X-direction, Y-direction and Z-direction in each case run crosswise (in particular perpendicular) to one another, so that in this connection, in particular a Cartesian coordinate system is formed.

An embodiment according to the present invention thus reduces the number of degrees of freedom required overall of components involved in the alignment, which are required for highly precise alignment of two substrates with one another.

According to the invention, a calibrating substrate, preferably two calibrating substrates, is/are used in order to perform an adjustment of the detection units to the movements of the substrates by means of the holders.

The embodiments according to the invention primarily show a new and inventive apparatus, with which the alignment and contacting of substrates is possible for the first time with high precision in a vacuum.

The invention is comprised of an alignment unit (device) with at least four detection units, in particular optics, two alignment units (first or upper and second or lower holder) each with a specimen holder and corresponding X-, Y-, and Z-translational units with motors for moving the optics of the detection units and the specimen holder. The alignment chamber can be open either to the atmosphere or is preferably located in a space that can be evacuated.

If the detection units are located outside of the alignment chamber, the alignment chamber has corresponding windows, through which the detection is carried out. By positioning the optics (or in general: detection units) within the alignment chamber, optical errors caused by the window are avoided, which could develop by the transmission of the beam through the window. For example, a deviation of the light path by non-plane cut window sides, intensity loss, absorption of specific wavelengths, refraction effects or a more diffuse holder would be conceivable because of the rough surface of the window. The mounting of the optics outside of the alignment chamber also provides advantages, however. The optics are easily accessible and need not be designed for vacuum environments. In addition, the motors, by which the optics are moved, also need not be designed for the vacuum operation.

In a quite special embodiment, the window is not planar on both sides, but rather it is itself designed as an optical element, which actively contributes to improvement of the magnification and/or resolution of structures within the chamber. By a corresponding highly precise manufacturing of the window, the refraction properties of the window can thus be actively used and specifically influence the light path, instead of falsifying and weakening the light path. It would be conceivable, for example, that the window itself is designed as a biconvex, biconcave, convex-concave or concave-convex lens. It is also conceivable that most of the window is designed to be planar on both sides, and the actual lens element is located separated from the edge in the inner part of the window.

At least two optics, preferably lying on the same side of the alignment chamber, preferably on the lower edge, have only a single degree of translational freedom, namely along the z-direction, and are therefore limited in particular to a pure linear movement.

The substrates, preferably wafers, are fixed to specimen holders. The specimen holders are mounted on holders. The holders in general have several translational units and/or rotational units, which make possible the translation or rotation of the specimen holder and thus the substrates, in particular the wafers. There are preferably precisely two holders, namely, a first or upper holder and a second or lower holder.

The upper holder has several degrees of freedom, preferably one for the X-direction, one for the Y-direction, as well as a degree of freedom of the rotation. Two additional degrees of rotational freedom and/or one degree of translational freedom would also be conceivable in the z-direction.

The lower holder preferably has one degree of translational freedom along the Z-direction. By eliminating other degrees of freedom, the lower holder can produce a highly precise and very precisely reproducible positional control of a wafer in the Z-direction.

Hereinafter, it is assumed that the components, i.e., the holders with only one degree of translational freedom, are always located on the bottom of the device or the alignment chamber while the components, i.e., holders, that have above a maximum number of degrees of freedom, are located on the top of the alignment chamber (preferred embodiment). In addition, in the case of the optics, a distinction is made between the left and the right optics, or detection units that can be arranged opposite. It would also be conceivable, however, to mount the components with only one degree of freedom on the top, or partially on the top and the bottom.

The alignment process according to the invention begins with the loading of a first calibrating substrate on the specimen holder of the first holder, in particular the upper holder. The first calibrating substrate has at least two markings, on two sides of the calibrating substrate that are opposite to one another.

In a first calibration step, the first calibrating substrate is moved to the left until its left marking is located in the field of vision of the left upper and lower optics. In this calibration step, the left lower optics is generally located not too far removed from the left marking in order to depict it in a defined manner. Therefore, the left lower optics is brought closer, by a highly precise and primarily reproducible shifting, to the left marking of the calibrating substrate until the latter is located in the depth of focus area of the left lower optics. Since the left lower optics cannot be shifted within a horizontal plane because of the freedom of movement that is limited to the Z-direction, the left marking of the substrate is made to coincide with the optical axis of the left lower optics by a translational movement of the calibrating substrate by means of the X- and Y-translational units.

The movements of the translational units can be detected exactly as detection data and are transferred to a control system, which is used to control the components of the device.

In a second calibration step, the left upper optics is oriented to the left marking of the calibrating substrate so that the optical axis thereof is aligned as exactly as possible with the left marking. The left upper optics can be fixed in this position. The Z-position of the left lower optics is stored in order to be able to move it back later to the same position.

In a preferred embodiment, the point of intersection of the two opposite optical axes is determined, or the two optical axes are aligned so that they cut into the marking.

It is preferably ensured by the focusing of the left marking by the left upper and right lower optics that the left marking is located in the depth of focus area (actually correctly focus depth area) of the two optics. The two depth of focus areas have, however, a finite extent, and can thus open a point of intersection area in which the point of intersection of the optical axes is located. The position of the point of intersection can be greatly limited by optics with correspondingly small depth of focus areas. Because of the reduction of the depth of focus area, the resolution of the optics, which has a likewise positive effect on the determination of the marking, also increases.

According to the invention, the optics is controlled in such a way that the position of the marking relative to the optical axis can be recognized, detected, and stored by the optics. Thus, in principle, it is desirable to ensure for this purpose that the marking comes to rest as centrically as possible and therefore as close as possible to the optical axis or halts at least within an area that is located around the optical axis. A perfect alignment of the optical axis to the marking could be a very time-intensive process and therefore a very expensive process in mass production. It is therefore preferred to produce the marking only in the field of view (English: field of view) of the respective optics and then to determine and to store the x- and y-distance of the marking relative to the optical axis.

In addition, it is taken into consideration that the image sensors that are used, with which the image of the respective optics is detected, as well as the optics themselves, have a slight distortion increasing from the optical axis to the edge, and thus the recorded images allow all the poorer a measurement of the marking position the farther the marking is removed from the optical axis.

Therefore, the marking is guided as fast as possible and as close as possible to the optical axis, without making the center of the marking and the optical axis coincide perfectly. The area in which a marking is preferably to stay is referred to with F'. According to the invention, the marking should thus be located at least in the field of vision F of the optics, but still more preferably in the area F'.

By this preferred process, in which the optical axes fix the left marking as precisely as possible but not exactly, a left zero point is determined, to which reference can be made, although the optical axes do not cut precisely into the left marking.

In a preferred embodiment, but one that is difficult to achieve or undesirable for reasons of time and cost, both optical axes are centered exactly on the left marking. The point of intersection of the two left optical axes then rests within the depth of focus areas of the two left optics and preferably even exactly in the center of the left marking. In this ideal case, the left point of intersection preferably corresponds exactly to the left zero point.

The two opposite detecting systems thus work together as a detecting pair. The left lower optics can be run into a starting position, in which it does not prevent the loading of the lower substrate introduced later into the alignment chamber.

In a third calibration step, the first calibrating substrate is run toward the right until its right marking is located in the field of vision of the right upper optics and the right lower optics. In this calibration step, the lower right optics is preferably located removed from, i.e. spaced apart from, the right marking so that first an approximate positioning is carried out. Then, the right lower optics is brought closer to the right marking, by a highly precise and reproducible shifting, until the latter is located in the depth of focus area of the right lower optics. Since the right lower optics cannot be shifted within a horizontal plane, i.e., in the X- and Y-directions, the right marking is brought closer to the optical axis of the right lower optics by a translational movement of the calibrating substrate over the upper translational unit and, in the ideal case, which is not necessarily desirable for reasons of time and/or costs, is made to coincide.

In a fourth calibration step, the right upper optics is oriented to the right marking of the calibrating substrate, as in the calibration of the left optics, where the upper left optics was oriented to the left marking. In turn, it is primarily only of importance that the right marking is located in the field of vision of the right upper optics. Preferably, the right marking should again be located as close as possible to the optical axis of the right upper optics in order to minimize possible measurement inaccuracies of the positional determination due to possible distortions of the holder sensor and/or the optics. According to an embodiment, it is provided to make the right marking and the optical axis of the right upper optics completely coincide.

The right upper optics is fixed in this position and under ideal circumstances must not be moved until it is aligned. The Z-position of the right lower optics is stored (detection data) in order to be able to move it later to the exact same position.

By this preferred process, in which the optical axes fix the left marking as precisely as possible, but not exactly, a left zero point is determined, to which reference can be made, although the optical axes do not cut precisely into the left marking.

In a preferred embodiment but one that is difficult to achieve, or undesirable for reasons of time and cost, two optical axes are centered exactly on the right marking. The point of intersection of the two right optical axes then rests at least within the depth of focus areas of the two right optics and preferably even exactly in the center of the right marking. In this ideal case, the right point of intersection preferably corresponds exactly to the right zero point.

The two opposite detection systems thus work together in particular as a detection pair. The right lower optics can now be run again in a starting position in which it does not prevent the loading of the lower substrate introduced later into the alignment chamber.

With these four calibration steps, the calibration of the optical axes of the two detection pairs is completed, and the depth of focus areas of the markings are known (detection data). The latter can be transferred/converted to the substrates that are similar in dimension to the first calibrating substrate.

The two optical axes are preferably aligned in such a way that they dissect the later bond plane. Since, as already mentioned, the exact determination of the point of intersection is possible only with a greater expenditure of time, the alignment according to the invention is carried out at least so that the later bond plane rests within the depth of focus areas of the optics, when they are located in those positions that were determined by the preceding calibrating process.

The optics in the focusing of a marking of a test substrate are preferably focused by the upper and lower optics in such a way that the marking (as already mentioned in detail above in the calibration steps) is exactly centered in the two optics. If it appears that the two optics are centered, both optics are aligned exactly with the marking, so that the point of intersection of the optics strikes in the marking.

To the extent that one of the two optics does not centrically detect the marking, an offset is stored between the marking and the optical axis by software, firmware or hardware and can be used for later conversions. If corresponding software, firmware or hardware thus stores the distance between the points of intersection of the optical axes in the later bond plane, an exact point of intersection of the optical axes in the later bond plane can be eliminated, and the offset is used in order to be able, to align the two substrates exactly with one another.

The lower optics can be run according to their stored Z-positions. Under ideal circumstances, this calibration need be performed only a single time. Should changes in the system be performed, however, for example the exchange of one or more optics, the exchange of mechanical parts or possibly even only a purification of the alignment chamber, it may be necessary to perform a renewed calibration. In particular, the calibration is then always to be performed when a shifting of the point of intersection of the optical axes of the left or right side is carried out or is established.

As the next step, the calibration is carried out between the upper optics and a second calibrating substrate, provided with several markings (in other words: a marking matrix), in particular in order to detect the X-Y movement of the translational units of the first holder and/or the translational units of the first detection units and to calibrate the latter accordingly.

Hereinafter, a distinction can no longer be made between the exact adjustment of an optical axis to a marking, on the one hand, and the approach between the optical axis and the marking, on the other hand, in the same way as was done in the previous paragraphs. Each of the two methods for determining the position of a marking is possible according to the invention. In order to keep the embodiments as simple as possible, hereinafter, reference is only to be made of an exact detection of a marking. The above-disclosed features apply analogously for the following embodiments. In a first calibration step, the second calibrating substrate moves under the left upper optics until one of the markings rests precisely centric to the optical axis of the left upper optics. Then, a fixing of the second calibrating substrate by the upper holder is carried out so that the latter remains at the same X-Y position during the next calibration steps.

In a second calibration step, the upper left optics points the markings of the marking matrix on the left side of the second calibrating substrate downward by means of the X- and Y-translational units of the detection unit and positions the left upper optics above any marking so that the currently controlled marking is arranged centric to the optical axis of the upper left optics.

The markings of the marking matrix of the second calibrating substrate are produced by a deposition process and are a highly precise, in particular equidistant and/or precisely known, distance apart. The distances between the markings of the marking matrix are less than 100 µm, preferably less than 10 µm, more preferably less than 1 µm, and most preferably less than 100 nm. The deviation or an error of the distances between the markings of the marking matrix is less than the resolution limit and/or the precision of the optics motors of the left upper optics.

The X-Y-positions of the control units are stored as detection data, by the central control system. The control system puts them into relation with the integrated value for the corresponding marking. As a result, two positional charts are obtained, an ideal/preset positional chart with ideal X- and Y-positions, and a real positional chart that can be correlated thereto and that indicates the real X- and Y-coordinates (or -positions) of the left upper optics. Both positional charts are linked/can be linked to one another via a bijective figure. By interpolation, a continuous positional chart can be produced in order to determine the real X- and Y-positions, which starts the left upper optics above the ideal X- and Y-positions.

In a third calibration step, the second calibrating substrate is moved under the right upper optics, until one of the markings rests precisely centric to the optical axis of the right upper optics. Then, a fixing of the second calibrating substrate by the upper holder is carried out so that the latter remains in the same X-Y-position during the next calibration steps.

A fourth calibration step for the upper right optics corresponds to the second calibration step, transferred to the right side.

A final calibration step according to the invention relates to the z-translational unit of the lower holder. According to the invention, the lower holder is provided with only one degree of translational freedom in the z-direction. In this configuration, a highly precise guiding of the lower holder is ensured. To the extent a deviation in the x-direction and/or the y-direction is possible in moving the lower holder along the z-direction, in particular by tilting the direction of movement of the lower holder relative to the z-axis or by errors in the positions, the movement of one or more markings within the x-y plane of the lower holder is observed according to a preferred embodiment of the invention. In particular, a shifting of the lower holder in the x-direction and/or y-direction is determined on one or more markings as a function of the position along the z-direction. In particular, the function is interpolated as a linear function. In this way, it is known in the control system or the software, firmware or hardware by which path, x- and/or y, a substrate is shifted when a path z is followed.

In a first embodiment, the observed marking always remains in the field of vision of the optics and in the depth of focus area thereof over the entire path z. This is only possible, however, for significant traveling distances in the z-direction when the depth of focus area is correspondingly large. This would be possible, if at all, only with optics with a small magnification and resolution capacity.

In a second, preferred embodiment, the upper optics is entrained with the substrate along the z-axis. Since the upper optics according to the invention in particular also have a z-translational unit, this is advantageous. This calibration step is preferably performed before all other above-described calibration steps so that the optics in the subsequent calibration steps no longer have to be moved in the z-direction.

In addition, it is conceivable according to the invention that the upper optics and the substrate are shifted (moved) several times along the positive and negative z-direction, and the optimal function is determined by taking averages of several such passes (movement).

In a third, even more efficient and more preferred embodiment, a calibrating substrate with at least four, in particular precisely four, markings is used: two markings on the top, in each case one on the left side and one on the right side, as well as two markings on the bottom, also in each case one on the left side and one on the right side of the calibrating substrate.

The calibrating substrate has a thickness that is known or measured exactly. The thickness is precisely known at least in the vicinity of the markings. In this case, the thickness of the calibrating substrate is at least in the vicinity of the markings precisely known as 100 µm, preferably precisely known as 10 µm, more preferably precisely known as 1 µm, most preferably precisely known as 100 nm, with utmost preference precisely known as 10 nm, and most preferably precisely known as 1 nm.

To the extent that markings that are opposite in each case are shifted toward one another in the x-direction and/or the y-direction, the relative distance in the x- and y-directions of two opposite markings is measured. The error in this case is in particular less than 100 µm, preferably less than 10 µm, more preferably less than 1 µm, most preferably less than 100 nm, with utmost preference less than 10 nm, and in a most preferred manner less than 1 nm.

In order to determine the deviation of the z-translational unit along the x-direction and/or the y-direction along a preset path, in contrast to the two previously-mentioned embodiments, the upper optics is focused in particular on the upper marking. Then, the z-translational unit, in a movement referred to as a partial calibration step, is brought toward the upper optics over a distance that corresponds to the thickness of the calibrating substrate. During the approach, the shifting of the z-translational unit in the x-direction and/or the y-direction can be measured by the shifting of the upper marking (and for the case that during the process, the lower marking is also located in the depth of focus area, by the lower marking). After the upper optics focuses the lower marking, the optics move until the upper marking is again in focus. Since the relative distance between the two markings in the x-direction and/or in the y-direction is never changed, the upper optics can—after the shifting in the z-direction—be set again to the same position relative to the upper marking in which it was found before this partial calibration step. An x-shifting and/or a y-shifting possibly produced by the z-movement of the upper optics is irrelevant for the determination of the x-shifting and/or the y-shifting of the translational unit, to the extent that the optics is again positioned relative to the upper marking before each new partial calibration step. This partial calibration step can be repeated over any distance.

In other words, the upper optics and the calibrating substrate move step for step and alternately along the path that is to be measured, whereby the optics is always oriented to the markings of the calibrating substrate before a new calibration step.

According to the invention, the reverse process is also conceivable, namely that the upper optics is first focused on the lower marking and the calibrating substrate is then moved away from the upper optics.

The upper optics then follows after the z-shifting of the calibrating substrate follows the same.

The calibration step is especially efficient when the upper and lower markings are always arranged inside the depth of focus area of the upper optics during the movement of the calibrating substrate. In this embodiment, the calibrating substrate is transparent. In addition, the calibrating substrate is selected as thin as possible, but as thick as necessary in order to prevent as much as possible a bending. The calibrating substrate in particular has a thickness of less than 2,000 µm, preferably less than 1,000 µm, more preferably less than 500 µm, and most preferably less than 100 µm. The calibration of the deviation of the z-translational unit in the x- and y-directions is especially efficient when the upper left optics performs the above-mentioned measurement on the left optics, and the upper right optics, at the same time, performs the measurement on the right side.

If this calibration step has also been completed, an exact prediction is possible as to how much a substrate shifts in the x-direction and/or the y-direction in the case of a movement in the positive or negative z-direction.

After all calibration processes with the calibrating substrates have been completed, the processing of the substrates can begin. Hereinafter, a preferred face-to-face alignment process is depicted in a previously correctly-calibrated embodiment according to the invention. In the case of a face-to-face alignment process, the markings are located on the contact surfaces of the two substrates that are to be bonded to one another. The face-to-face alignment process is to serve as an alignment process by way of example. It is also a suitable example, since it depicts the most complicated alignment process. This is due to the markings not being accessible during the approach of the substrates for the optics, i.e., the substrates are brought together in an almost-blind manner, in a face-to-face alignment process.

Performing a back-to-back process, a face-to-back process and a back-to-face process would also be conceivable. In a back-to-back process, the alignment marks are always located on the outer sides of the substrates. The use of the embodiment according to the invention for such an alignment process is conceivable in principle, but does not represent any challenge since the markings are completely accessible at any time, in particular during the approach of the two substrates toward one another. Thus, by the correspondingly positioned optics, an in-situ measurement of the markings is conceivable (contemplated) during the alignment process. The back-to-face or face-to-back alignment process is any alignment process in which the marking of a substrate is covered, since it is located in the direction of the subsequent bond interface, while the second marking can be observed continuously.

In a first process step according to the invention, a first substrate in the alignment chamber is loaded in the first holder and fixed on the latter. The orientation of the substrate is done either before loading into an external prealigner or within the chamber by an internal aligner. In this case, the substrate is positioned and oriented relative to its typical features, such as, for example, a flat side (English: flat) or a notch.

Then, the translational unit of the first holder moves the loaded substrate toward the left until the left marking is located in the field of view (English: field of view, FOV) of the left lower optics. In order to be able to sharply image the left marking, the latter must be located in the depth of focus area of the left optics. The left optics was calibrated in the previous calibrating process in the approximate depth of focus area, in particular relative to the similar, preferably identical, dimensioned calibrating substrate. The stored Z-position of the left lower optics can be used to move the left lower optics into the exact same Z-position. The approach of the left lower optics can be carried out in particular at the same time with the movement of the upper loaded substrate in order to save time and to optimize the process.

To the extent that the left marking of the upper substrate is not located precisely in the optical axis of the left lower optics after the left lower optics is retained in the depth of focus area, both optical axes are made to coincide with one another by a precise control of the first substrate, in particular with the upper holder. Then, storage of the encoder positions (detection data) of the upper holders can be carried out for all degrees of freedom. The current encoder positions are thus clearly assigned to the left upper marking.

According to the invention, an encoder position is defined as any value that provides information on the position and/or orientation of an object, in particular a substrate. These include, for example, the motor positions of a motor, which are read out directly from the motor electronics, the positions of an object that are determined by an interference method, the position of an object that was determined by means of optical measuring systems such as interferometers or the like, or the position that was determined via a scale of length. Position of an object is defined as, for example, the position of the translational units that is measured in a highly precise manner by means of an interferometer and to which a substrate was fixed statically.

In a second process step according to the invention, the first process step is performed analogously for the right marking of the first substrate on the right side that is in particular precisely opposite. The second process step can also be carried out before the first process step.

After these process steps, all encoder positions are known for both markings of the upper substrate. As a reference point, either the left zero point, the right zero point, or a zero point calculated from the left and right zero points can be used. Preferably, however, one of the physical zero points defined by the point of intersection of the optical axes of the left or right optics is used.

In a third process step according to the invention, another second substrate is loaded in the alignment chamber on the specimen holder of the second holder and is centrically fixed to the latter. Then, one of the translational units of the upper holder moves the first substrate far enough to the right that the left upper optics has a clear view of the left marking of the just-loaded, second (lower) substrate. In this case, the upper left optics should preferably already be positioned so that it has the left marking of the lower substrate in the field of vision. The lower substrate is raised by the translational unit of the lower holder until the left marking is located in the depth of focus area of the upper left optics. Then, the shifting of the upper left optics is carried out in the X-direction and/or the Y-direction by making the optical axis of the left upper optics coincide with the left marking of the lower substrate. The shifting of the upper left optics relative to the left zero point is stored (detection data).

In a fourth process step according to the invention, the third process step is performed analogously for the right marking of the second substrate on the right, opposite, side. The fourth process step can also be implemented before the third process step.

In a fifth process step according to the invention, all determined positions of all degrees of freedom of the first and second holders, in particular the upper and lower holders, are used as detection data in order to align the two substrates with one another relative to their left and right markings. In this case, the alignment process itself is carried out independently of the detection units, i.e., without further use of optics. In general, all translational units and/or rotational units of the lower and/or upper holders are used in order to orient the two substrates with one another.

A conceivable alignment sequence according to the invention would be as follows. First, the upper substrate is loaded. The substrate is moved until the left and right marking of the lower left or the lower right optics was focused centrically. The encoder positions are correspondingly stored. Then, the loading of the lower substrate and the focusing of the left or right marking is carried out using the upper optics. Since the lower substrate cannot be moved in the x-direction and/or the y-direction, the markings must be located at least in the fields of view (English: field of view) of the upper left or upper right optics. Since the distance of the markings to the optical axes can be determined, the encoder positions of the upper substrate relative to the optical axes were determined exactly, and the upper substrate can be moved (the upper substrate can be moved at any time to the necessary x-position and/or y-position) so that the markings of the upper substrate are positioned exactly over the markings of the lower substrate. Preferably, the z-distance between the two substrates during this process is already as small as possible.

In a sixth process step according to the invention, bringing the two substrates into contact is carried out. The contacting preferably takes place, exclusively, by a raising of the lower substrate by the translational unit of the lower holder. Since the lower holder has only a single, highly precise translational unit and therefore the lower substrate is moved—can be moved—exclusively in the Z-direction. No, or at least only an insignificant, X-deviation and/or Y-deviation is carried out during the approach. The deviation of the lower substrate in the x-direction or y-direction during the process of the approach to the upper substrate in the z-direction is in this case smaller than 10 µm, preferably smaller than 1 µm, more preferably smaller than 100 nm, most preferably smaller than 10 nm, and with utmost preference smaller than 1 nm.

In a seventh process step according to the invention, a fixing, i.e. bonding, of the upper substrate with the lower substrate is carried out. A mechanical, electrostatic, magnetic, electric fixing or a fixing performed by means of films or adhesives of the two substrates to one another is also contemplated. An Si—Si or $SiO_2$—$SiO_2$ direct bond between the two substrates would also be especially preferred. The substrates can either be fixed to one another or fixed relative to the lower specimen holder. However, the specimen holder is preferably used only for holding substrates during the alignment process, and a fixing of the two substrates to one another is carried out so that the specimen holder remains in the alignment unit after the removal of the substrate stack and thus is available immediately for the next alignment process.

A method as shown in the patent specification PCT/EP2013/056620 is preferably used in order to fix the substrates magnetically to one another. By this special fixing method, it is possible to eliminate a specimen holder that is heavy, expensive and difficult to handle or to leave a specimen holder in the alignment unit in order to be able to use it immediately again after the removal of the substrate stack.

In another special embodiment, at least one substrate is loaded on a specimen holder so that the alignment of a second substrate with the substrate fixed to the specimen holder is carried out, and both substrates are fixed relative to the specimen holder. By this procedure, two substrates can be aligned with one another, fixed to the specimen holder and directly (i.e., fixed to the specimen holder) transported into another process chamber. Especially preferably, further transport into a bonding chamber is carried out, in which then a bonding step, in particular with a pressurization of the two substrates, is performed.

According to one aspect of the invention, the Z-positioning of all components of a selected side, i.e. the lower side or the upper side, can be performed with extremely high precision and primarily reproducibility. The control of a z-position is carried out with a precision of less than 10 µm, preferably less than 1 µm, more preferably less than 100 nm, and most preferably less than 10 nm. This primarily is due to additional degrees of freedom, which could lead to a negative influencing of the precision and reproducibility of the Z-positioning, being eliminated.

Substrates are defined as product substrates or carrier substrates that are used in the semiconductor industry. A carrier substrate serves as an enhancement of the function substrate (product substrate) in the different working steps, such as during back-thinning of the function substrate. Suitable substrates, e.g., wafers, come either with smoothing ("flat") or grooving ("notch").

Functional components of the device according to the invention such as slides, motors, optics and holding devices are preferably built in a housing. The housing is hermetically sealable to the environment. The housing preferably has a cover that makes possible the access to the functional components. In particular, a flood-gate is provided on at least one side of the housing. A corresponding sluice can be upstream and/or downstream from the flood-gate. When a sluice is used before and/or after the flood-gate, a different atmosphere can preferably be set in the housing than in the environment of the housing. The atmosphere in the housing is preferably an underpressure atmosphere.

During an alignment process according to the invention, the pressure in the interior of the housing of the alignment chamber is in particular equal to 1 bar, preferably less than $10^{-1}$ mbar, more preferably less than $10^{-3}$ mbar, most preferably less than $10^{-5}$ mbar, and with utmost preference less than $10^{-8}$ mbar.

During an alignment process according to the invention, the pressure outside of the housing is equal to 1 bar, preferably less than $10^{-1}$ mbar, more preferably less than $10^{-3}$ mbar, most preferably less than $10^{-5}$ mbar, and with utmost preference less than $10^{-8}$ mbar.

All substrates can be introduced either via a flood-gate or the cover into the interior. Preferably, the substrates are transported via the flood-gate into the interior.

In a special embodiment, the transport of the substrates or of the substrate stack, consisting of the substrates that are aligned with one another, from the housing is carried out by means of a robot.

The precision with which the detecting devices of the detection units can be moved individually is better than 1 mm, preferably better than 100 μm, more preferably better than 10 μm, even more preferably better than 1 μm, and yet even more preferably better than 100 nm, and with utmost preference better than 10 nm.

In the alignment unit, a first holder for one of the two substrates is located exclusively on the top. A specimen holder is located in the first holder as a component of the first holder. The specimen holder has at least three, and in one embodiment, six, degrees of freedom, at least three degrees of freedom of the translation along the X-direction, the Y-direction and the Z-direction, as well as optionally three degrees of freedom of the rotation around the X-axis, the Y-axis, and the Z-axis, referred to below with the angles alpha, beta and gamma. The degrees of translational freedom serve to shift the specimen holder and thus the substrate within the X-Y plane formed by the X-direction and the Y-direction as well as the approach of the two substrates toward one another along the Z-direction. The capability of rotating around the X-axis, the Y-axis, and the Z-axis serves to perform a wedge error adjustment and/or the orientation of the substrate. The rotations around the X-axis, the Y-axis, and the Z-axis are rotations with small rotational angles, so that tilting could also be a possibility.

According to the invention, specimen holders can be used as holders for the substrates, with the following different fixing mechanisms:

Vacuum specimen holder
Electrostatic specimen holder
Specimen holder with an adhesive surface
Specimen holders, which are based on Venturi and Bernoulli effects
Magnetic specimen holder
Specimen holder with mechanical attachments and/or clamping mechanisms When using the embodiment according to the invention in a vacuum environment, vacuum specimen holders and/or Venturi and/or Bernoulli specimen holders are used only to a limited extent, and in the extreme case, not at all.

Before the actual alignment process, a calibration of the detecting means is advantageous. As already mentioned, two opposite optics are calibrated at least to the extent that one marking per side is located at least in the fields of vision of the upper and lower optics, preferably within an area that lies as close as possible to the optical axis of the upper or lower optics.

In a preferred embodiment, the purpose of the calibration consists in placing the point of intersection of the optical axes of two, opposite, detecting devices in the center of a marking of a calibrating substrate. This calibration is preferably carried out separately for all detecting devices of the detection units.

By the calibration, it is ensured that opposite (upper and lower) detecting devices of a detection unit have a common focus area.

In a still more preferred embodiment, the optical axes of opposite detecting devices are aligned with one another in a collinear manner. In this configuration, at least one of the detecting devices has the upper degree of rotational freedom, preferably by arrangement on a goniometer.

A point of intersection or the point of intersection of the optical axes of the detecting devices is arranged according to the invention so that the corresponding markings of the substrates to be aligned in the detecting position in the X-direction, Y-direction and Z-direction can at least be focused and/or arranged or are arranged at this point. By this measure, the traveling distances are further minimized.

The points of intersection of the optical axes are preferably located in the focal plane, or at least in the depth of focus area, of the optics. Resolution and depth of focus area are two parameters that are concurrent with one another. The greater the resolution, the smaller the depth of focus area and vice versa. If optics with a high resolution capability are used, the latter thus have a correspondingly small depth of focus area. As a result, the alignment marks of the upper and lower substrates must simultaneously stay within a very small depth of focus area in order to be able to still be sharply imaged. According to the invention, therefore, the point of intersection of the optical axes is arranged in the depth of focus area of the corresponding detecting devices.

According to the invention, it is advantageous when the detecting devices are calibrated in such a way that the contact surfaces and/or the markings of the substrates are arranged in the detection positions of the respective detection units within the depth of focus areas. As a result, a secondary focusing can be eliminated.

The control of the movement of the substrates and/or detecting means is carried out by means of a control system that is software-supported.

Because of the invention, it is possible, after a calibration of the system, to fix a first substrate on a first holder (specimen holder) and a second substrate on a second holder. The first holder and the detection units that are movable in the X- and Y-directions, spatially assigned to the first holder, run the first substrate, symmetrically, into different, separate detecting positions arranged laterally opposite the alignment unit.

The invention is also based primarily on the idea of designing the detecting means necessary for the alignment process in such a way that in each case, two detecting devices that are directed toward one another, i.e. on opposite sides of the alignment unit, detect the X-Y-positions of markings of the substrates, whereby one of the detection units is fixed/immovable in the X- and Y-directions. One of the substrates, i.e. the substrate that is assigned spatially to the immovable detection units (preferably arranged between the latter), is also fixed/immovable in the X- and Y-directions. In the method according to the invention, the traveling distance of the two substrates is thus minimized as a whole.

If, one of the two holders and/or a detection unit of each detecting pair moves/move in particular exclusively along the Z-axis, translational units can be used with a very high precision and reproducibility. If a drift is carried out in an X-direction and/or the Y-direction, the latter can advantageously be measured and compensated according to the invention.

According to the invention, a distance between the substrates in the Z-direction from before detection until alignment is set constant and/or is minimized, i.e. less than 1 cm, preferably less than 1 mm, and still more preferably less than 100 μm.

The advantage of the invention primarily lies in the fact that the device can also be operated in a vacuum. Because of the comparatively short traveling distances between the upper and/or lower holders and thus of the first (lower)

and/or second (upper) substrate, mechanical components for slides/bearings/stepper motors that are vacuum-suitable can be used. Thus, for the first time, it is possible to install a bonding module and an alignment module in a vacuum cluster, preferably a high-vacuum cluster, and to perform the substrate transport from the alignment module to the bonding module within an area that can be evacuated, without the substrate having to be exposed to an atmosphere.

Another advantage according to the invention primarily lies in the higher positioning precision of the two substrates to one another, which can be attributed to the fact that one of the two holders, i.e. the lower holder, only has one translational unit and thus an error in the x-direction and/or the y-direction is largely suppressed during the approach to the second substrate. The mechanical play of the translational unit in the x-direction and/or the y-direction can be largely ignored because of the design.

Another advantage lies in the possible use of visible light. The alignment of two substrates by markings applied on their bonding sides could in many cases also be carried out using infrared light. Infrared light, in particular infrared light in the near infrared range is absorbed by pure silicon almost not at all. The problem primarily exists in that substrates that are surrounded in the area of the markings by pure silicon are present only in the fewest cases. In the majority of all cases, the silicon substrates have been damped with the most varied metal layers. Metals absorb the infrared radiation very well, and therefore act as barriers for the infrared light. The higher the packing densities of the functional units on the substrate, the more metal layers are deposited and the more complicated corresponding substrates are treated, the more unlikely is the use of infrared optics for a face-to-face alignment. The method according to the invention allows the use of light in the visible wavelength range. As a result, significantly better detectors and optical elements can thus be used. The optical elements for the infrared optics in most cases react in a very sensitive manner to the environmental parameters such as atmospheric humidity, are very brittle, and must be built in a correspondingly compact manner.

Accordingly, the prices of these optical elements are high. One of the core aspects of the device according to the invention and the process according to the invention thus consists in the fact that a direct observation of the surface can be carried out, and in the alignment process, reliance cannot be placed on the transparency of wafers.

Therefore, the use of transmission techniques can be eliminated according to the invention. In addition, all substrates, even opaque substrates for the wide range of the electromagnetic spectrum, can be measured, since the markings on the surfaces can be traced without the substrate having to be x-rayed. Nevertheless, it is conceivable to use all known and appropriate wavelength ranges of the electromagnetic spectrum to perform the detection of markings. In particular, the use of infrared light, preferably near-infrared light, is also disclosed when its use is of secondary importance.

In all figures, the holders are always depicted within the housing. It would naturally also be conceivable that the holders, and thus the translational units and/or rotational units, are located outside of the housing and by corresponding vacuum performances control the specimen holders that are located inside the housing. The same also applies for the detecting means. In the most optimal embodiments that are, however, technically difficult to produce, of course, only the two substances that are to be aligned with one another would be located in a vacuum.

The embodiment according to the invention is preferably used in a vacuum cluster, even more preferably in a high-vacuum cluster, and with utmost preference in an ultra-high vacuum cluster, together with other modules. The other modules can be, for example, one or more of the following modules:

Heating module
Cooling module
Coating module
Bonding module
Debonding module
Inspection module
Lamination module
Surface treatment module
Plasma module In a special embodiment, the substrates that are aligned with one another are clamped together with a method disclosed in the patent specification PCT/EP2013/056620, to which reference is made in this respect. The clamping method uses small magnetic bodies for quick, efficient and easy fixing of the two substrates that are brought into contact and aligned with one another. The two substrates can also be prefixed with molecular forces. The clamping can also be done in a purely mechanical manner, however.

To the extent that device features are present and/or disclosed in the subsequent description of the figures, the latter are also to be considered disclosed as method features and vice versa.

Additional advantages, features and details of the invention follow from the subsequent description of preferred embodiments as well as based on the drawings.

A BRIEF DESCRIPTION OF THE DRAWINGS

Figure 2B:
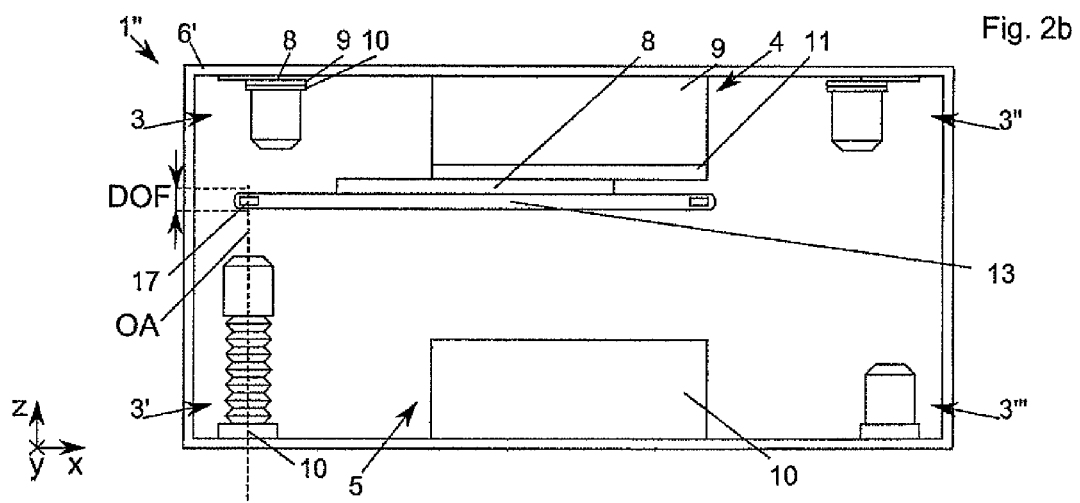
Figure 2C:
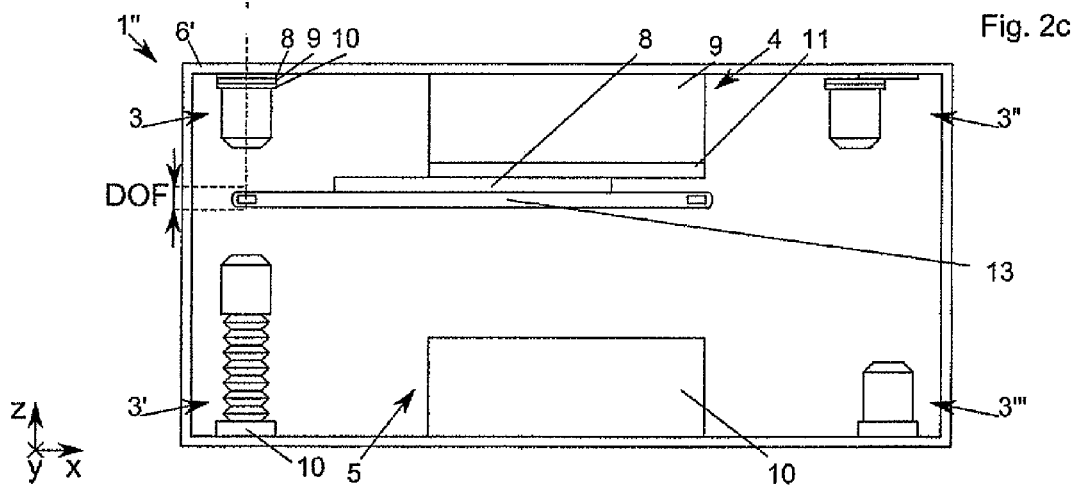
Figure 4A:
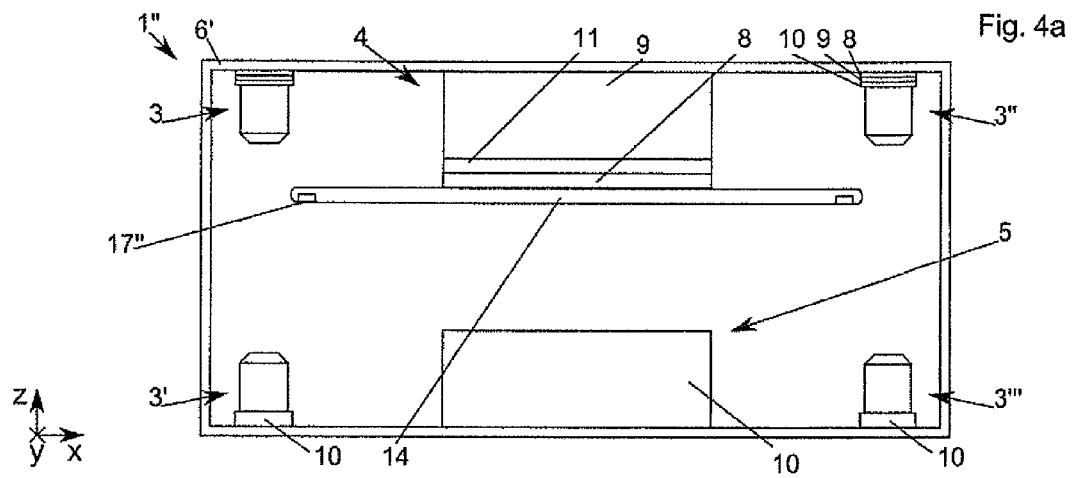
Figure 4B:
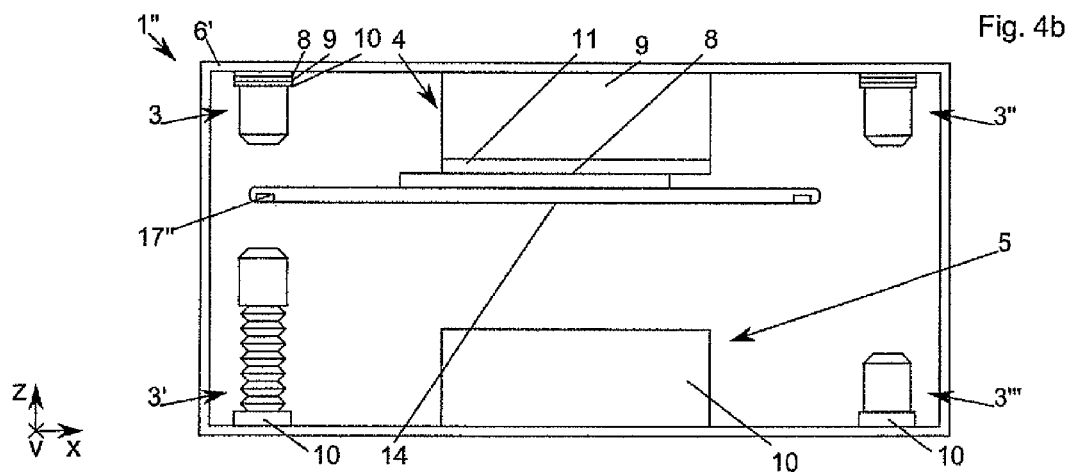
Figure 4C:
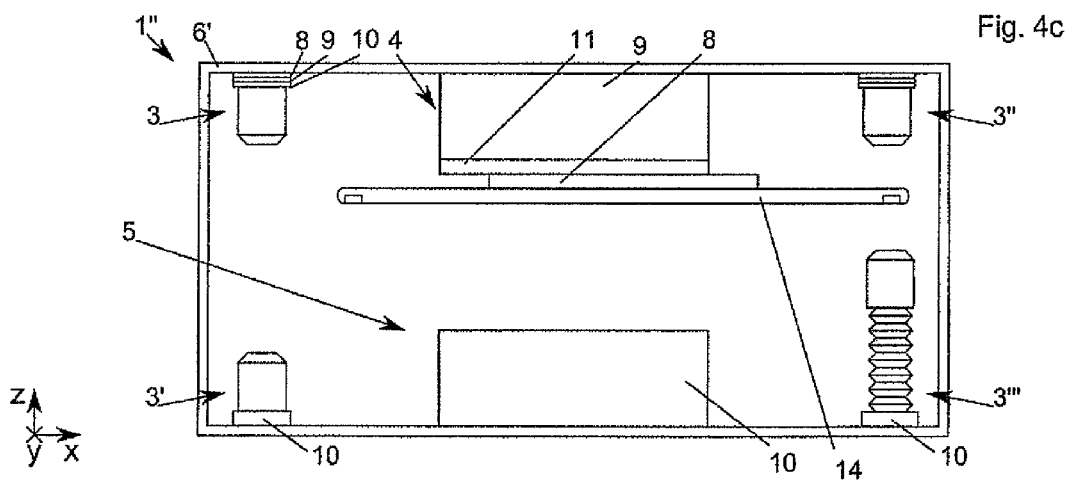
Figure 5A:
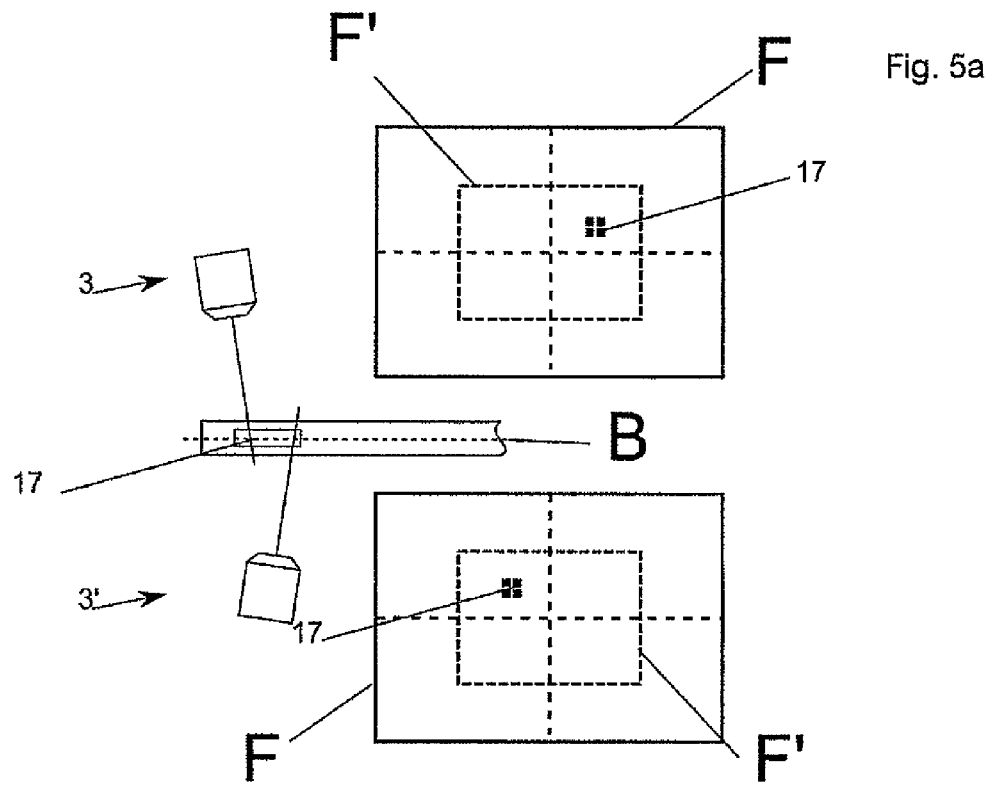
Figure 5B:
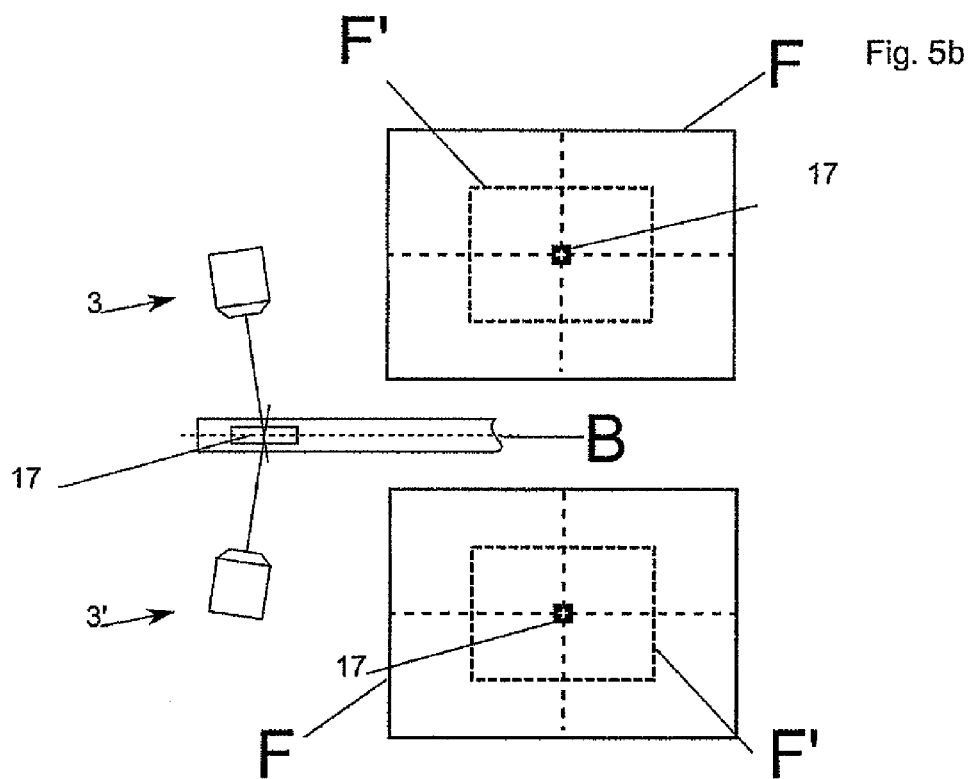
Figure 6A:
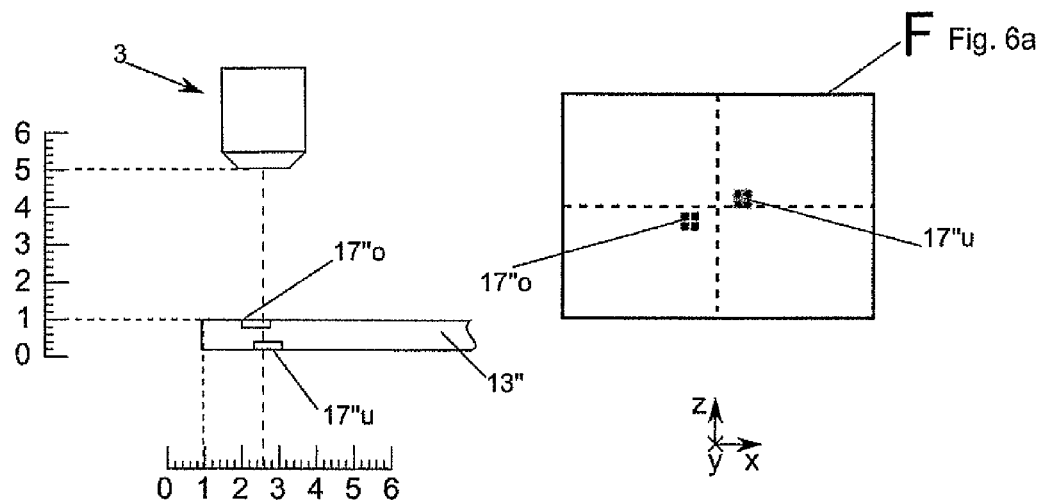
Figure 6B:
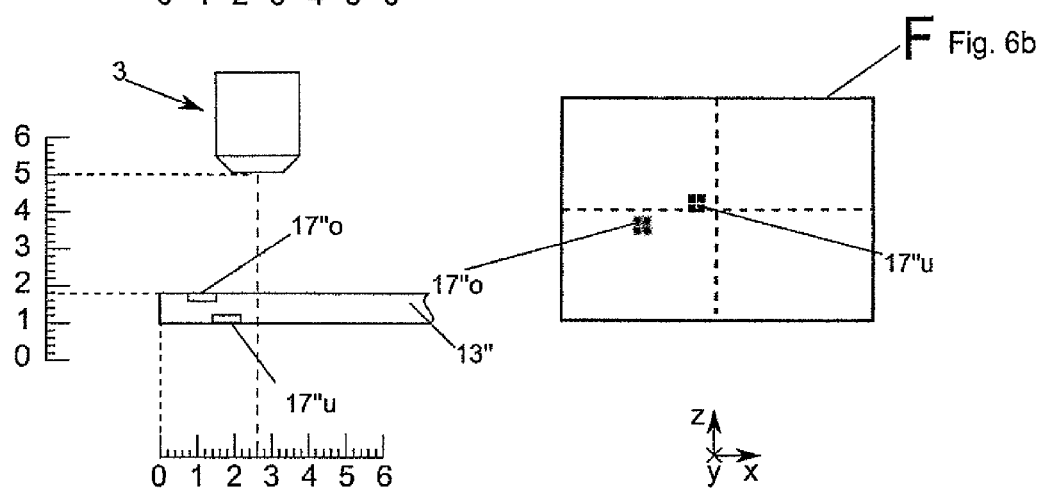
Figure 6C:
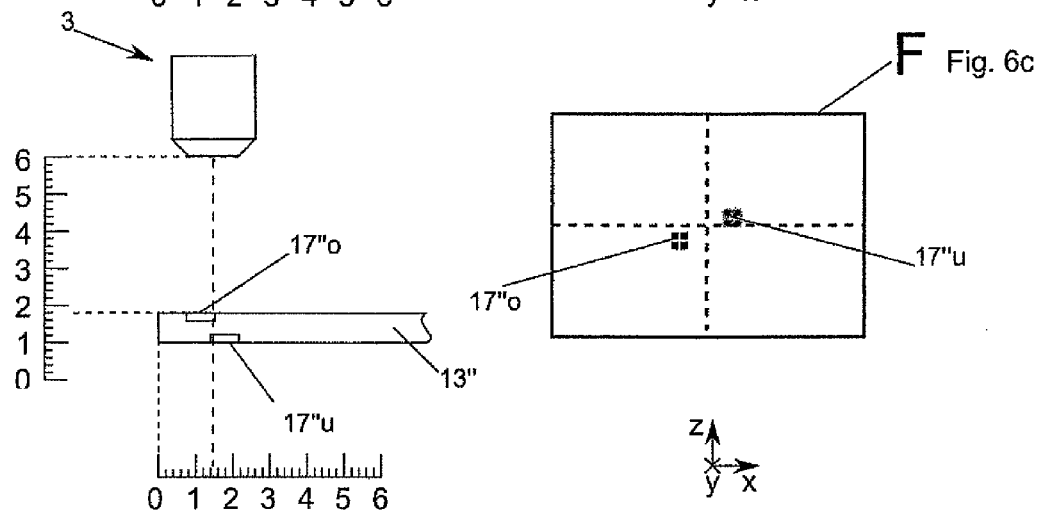
Figure 7:
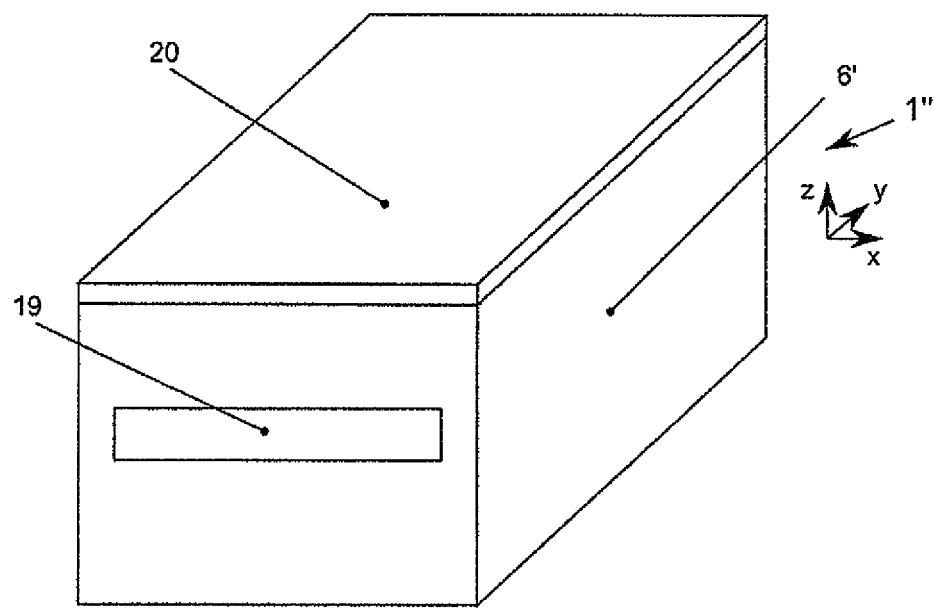
Figure 8:
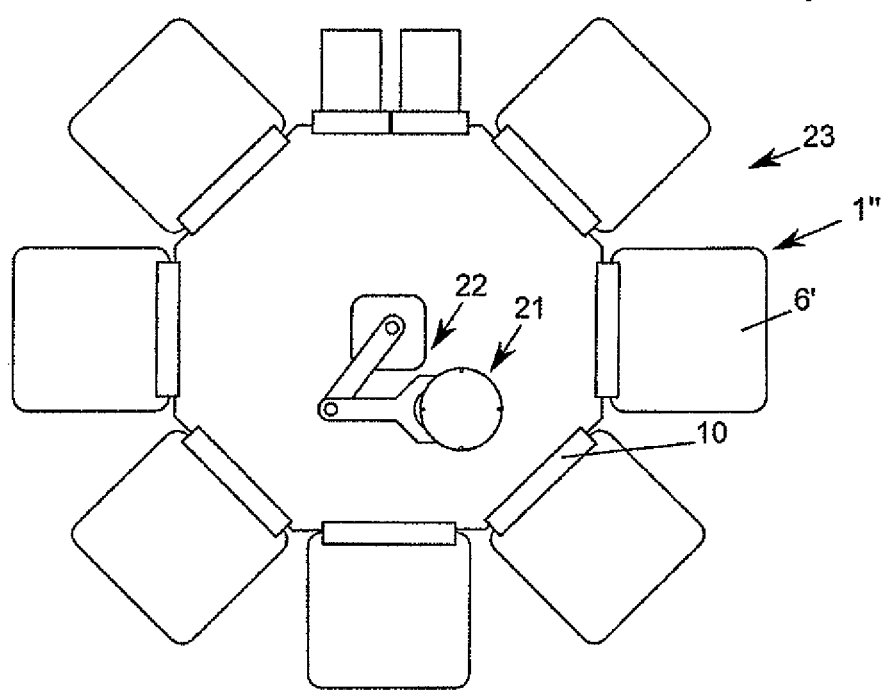

FIG. 1a is a diagrammatic cross-sectional visualization of a device according to the invention in a first embodiment, FIG. 1b is a diagrammatic cross-sectional visualization of the device according to the invention in a second embodiment, FIG. 1c is a diagrammatic cross-sectional visualization of the device according to the invention in a third embodiment, FIG. 2a is a diagrammatic visualization of a method according to the invention in a first calibration step with a first calibrating substrate, FIG. 2b is a diagrammatic visualization of the method according to the invention in a second calibration step with the first calibrating substrate, FIG. 2c is a diagrammatic visualization of the method according to the invention in a third calibration step with the first calibrating substrate, FIG. 2d is a diagrammatic visualization of the method according to the invention in a fourth calibration step with the first calibrating substrate, FIG. 2e is a diagrammatic visualization of the method according to the invention in a fifth calibration step with the first calibrating substrate, FIG. 2f is a diagrammatic visualization of the method according to the invention in a sixth calibration step with the first calibrating substrate, FIG. 3a is a diagrammatic visualization of the method according to the invention in a first calibration step with a second calibrating substrate, FIG. 3b is a diagrammatic visualization of the method according to the invention in a second calibration step with the second calibrating substrate, FIG. 3c is a diagrammatic visualization of the method according to the invention in a third calibration step with the second calibrating substrate, FIG. 4a is a diagrammatic visualization of the method according to the invention in a first method step for fixing a first substrate on a first holder, FIG. 4b is a diagrammatic visualization of the method according to the invention in a second method step for detecting a position of the first substrate, FIG. 4c is a diagrammatic visualization of the method according to the invention in a third method step for detecting a position of the first substrate, FIG. 4d is a diagrammatic visualization of the method according to the invention in a fourth method step for detecting a position of a second substrate, FIG. 4e is a diagrammatic visualization of the method according to the invention in a fifth method step for detecting a position of the second substrate, FIG. 4f is a diagrammatic visualization of the method according to the invention in a sixth method step for aligning the substrates, FIG. 4g is a diagrammatic visualization of the method according to the invention in a seventh method step for bringing the substrates into contact, FIG. 5a is a diagrammatic visualization of a calibrating state of two optics, whose point of intersection does not lie centrically to a marking, FIG. 5b is a diagrammatic visualization of a calibrating state of two optics, whose point of intersection lies centrically to a marking, FIG. 6a is a diagrammatic visualization of a third calibrating method according to the invention in a first partial calibration step, FIG. 6b is a diagrammatic visualization of a third calibrating method according to the invention in a second partial calibration step, FIG. 6c is a diagrammatic visualization of a third calibrating method according to the invention in a third partial calibration step, FIG. 7 is a diagrammatic, perspective, outside visualization of an embodiment of the device according to the invention, and FIG. 8 is a diagrammatic visualization of a cluster system with the device according to the invention.

DETAILED DESCRIPTION OF PREFERRED EMBODIMENT

In the figures, advantages and features of the invention are characterized with these reference numbers to be identified in each case according to embodiments of the invention, whereby components or features with functions that are the same or that have the same effect are characterized with identical reference numbers.

FIGS. 1a-1c show respectively diagrammatic cross-sections of three embodiments of alignment units 1, 1', 1" comprised of:

A first detection unit 3 in the form of a left upper optics or with a left upper optics.

A second detection unit 3' in the form of a left lower optics or with a left lower optics, as well as Another first detection unit 3" in the form of a right upper optics or with a right upper optics, and Another second detection unit 3'" in the form of one right lower optics or with one right lower optics, A first holder 4 in the form of an upper holder or with an upper holder, as well as A second holder 5 in the form of a lower holder 5 or with a lower holder 5.

The first detection units 3, 3" are able to move in all three directions in space X, Y and Z due to an X-translational unit 8, a Y-translational unit 9, and a Z-translational unit 10. In special embodiments, it would also still be conceivable that rotational units are incorporated, which allows a rotation of the optical axis around three axes that are orthogonal to one another. In a special embodiment, the actual optics would then be mounted on, by way of example and not limitation, a goniometer. In order to simplify the visualization, these rotational units are not depicted in the drawings.

The two second detection units 3', 3'" that are arranged at the bottom have exclusively a Z-translational unit, so that the latter can be moved exclusively along the Z-direction. The first holder 4 has at least one Y-translational unit 9, a phi-rotational unit 11, as well as an X-translational unit 8. The additional uses of rotational units and/or Z-translational units are also conceivable.

The X-translational unit 8 has a comparatively large maximum traveling distance, which is about twice, preferably four times, as large as the maximum traveling distance in the Y-direction. The traveling distance is in particular between −0.1 mm and 0.1 mm, preferably between −1 mm and 1 mm, more preferably between −5 mm and 5 mm, most preferably between −50 mm and 50 mm, and with utmost preference between −150 mm and 150 mm.

For the method according to the invention, the Y-translational unit 9 can have a much smaller traveling distance, but in this respect a traveling distance with much higher resolution. The traveling distances are smaller than 50 mm, preferably smaller than 10 mm, more preferably smaller than 5 mm, and most preferably smaller than 1 mm.

The resolution of the positioning capacity of all translational units used is in particular better than 100 μm, preferably better than 10 μm, more preferably better than 1 μm, most preferably better than 100 nm, and in the most preferred manner better than 10 nm.

The phi-rotational unit 11 makes it possible for a loaded calibrating substrate 13, 13' or a substrate 14, 14' to rotate around its surface normal. The capability of rotation primarily serves to compensate for a calibrating substrate 13, 13' or substrate 14, 14' that may be incorrectly preadjusted by several angular degrees. The resolution of the positioning capacity of all rotational units that are used is better than 1°, preferably better than 0.1°, more preferably better than 0.01°, most preferably better than 0.001°, and in the most preferred manner better than 0.0001°. The angle of rotation, which must be able to control the phi-rotational unit 11, is comparatively small, since the phi-rotational unit 11 serves only for very small orientation corrections of a substrate that is already loaded in an ideal manner. The angle of rotation of the phi-rotational unit 11 is therefore in particular smaller than 10°, preferably smaller than 5°, and more preferably smaller than 1°.

The sequence of the Y-translational unit 9, the phi-rotational units 11, as well as the X-translational unit 8—seen as optimal in the drawings—can, if necessary, be changed at will. Another especially preferred embodiment was the fixing of the phi-rotational unit 11 to the X- or Y-translational units 8, 9 or the fixing of the X- or Y-translational units 8, 9 to the phi-rotational unit 11.

FIG. 1a shows a first alignment unit 1 according to the invention, in which all detection units 3, 3', 3" and 3'" as well as all holders 4, 5 are located under atmosphere 15. The above-mentioned components are at most connected to one another by a frame 2 that in general is open to the atmosphere, closed in special cases, but not vacuum-sealed.

FIG. 1*b* shows a second and preferred alignment unit 1' according to the invention in which the first holder 4, the second holder 5, as well as the second detection units 3', 3''' are located in a vacuum chamber 6 (or housing), while the first detection units 3, 3" are mounted outside of the vacuum chamber 6 on a support frame 2. Windows 7 allow the detection in the interior of the vacuum chamber 6 by means of the optics of the first detection units 3, 3".

FIG. 1*c* shows a third alignment unit 1" according to the invention, in which all invention-relevant components according to the claims are located within a vacuum chamber 6'.

FIG. 2*a* shows a first calibration step for the calibration of the points of intersection of the optical axes of all four detecting devices or optics of the first and second detection units 3, 3', 3" and 3''', which begins with the fixing of a first calibrating substrate 13 to the first holder 4. The specimen holder for fixing the calibrating substrate 13 was not shown in the drawings for the sake of clarity.

The calibrating substrate 13 has two markings 17, on opposite sides thereof, namely on the outside edge area of the lateral peripheral contour of the calibrating substrate 13. The material of the calibrating substrate 13 is transparent to the electromagnetic radiation, which is used by the detecting devices 3, 3', 3" and 3'''. Primarily the use of visible light, of infrared radiation, of UV radiation or any other conceivable electromagnetic radiation that can be used for the detection of alignment marks are conceivable. Preferably, however, visible light is used. The markings 17 are located either on one of the two surfaces 13*i*, 13*a* of the calibrating substrate 13 or in its center (relative to the axial direction of the calibrating substrate 13).

In a second calibration step according to the invention (best seen in FIG. 2*b*), the first holder 4 moves the calibrating substrate 13 by its X-translational unit 8 in the negative X-direction (i.e., toward the left in FIG. 2*b*) until the left marking 17 is located in the field of vision of the lower left optics. To the extent that the marking 17 is not located in the depth of focus (English: depth of focus, DOF) of the left lower optics, the lower optics 3' is moved in a corresponding manner by a Z-translational unit 10.

If the left marking 17 is in the field of vision and depth of focus area of the left lower optics, the exact positioning of the left marking 17 can be carried out by the X-translational unit 8 and/or the Y-translational unit 9 and/or the phi-rotational unit 11 of the first holder 4 on the optical axis OA of the corresponding second detection unit 3', here the left lower optics.

Since the left lower optics according to the invention cannot move in the X-direction and/or the Y-direction, the object of the marking alignment of the marking 17 is performed relative to the optical axis OA of the left lower optics 3' from the translational units and the rotational units of the first holder 4. The movements of the translational units and rotational units can be detected, and the detecting data is transferred to the central control unit for further processing and control.

In a third calibration step according to the invention, shown in FIG. 2*c*, with the first calibrating substrate 13 disposed to the left, the left marking 17 of the calibrating substrate 13 is detected with the first detection unit 3, i.e. the upper left optics. In contrast to the lower left optics, the first detection unit 3 has at least three degrees of translational freedom.

The upper left optics 3 therefore uses its X-translational unit 8, its Y-translational unit 9, and its Z-translational unit 10 to move to a position to detect the left marking 17 within the field of vision and the depth of focus area. To the extent that the left upper optics 3 is located at a very small distance from the calibrating substrate 13, no change or only a slight change of the Z-position is necessary.

After the optical axes OA of the left lower optics and the left upper optics have been aligned with the left marking 17, the corresponding encoder stores the positions of all translational units and rotational units of the first holder 4, all encoder positions of the translational units of the first detection unit 3, and the encoder positions of the Z-translational unit of the second detection unit 3' as "detecting data." The stored encoder positions of the upper left optics 3 as well as the encoder position of the z-translational unit of the lower left optics 3' are preferably set as zero point. The detecting data are processed by the control system.

In FIGS. 2*d* to 2*e*, the above-described calibrating process is carried out relative to the right marking 17 of the first calibrating substrate in a corresponding manner. After the calibration of the four detection units 3, 3', 3" and 3''' and the upper holder 4 or to the upper holder 4, the calibrating substrate 17 is run into its starting position according to FIG. 2*f* and can be removed again from the alignment unit 1" according to the invention.

FIG. 2*f* shows the final state after the first calibration of the alignment unit 1" according to the invention.

In an advantageous embodiment, the calibrating substrate 13 with precisely one marking 17 per side is replaced by a calibrating substrate 13', which is explained in more detail in the following sections. Per side, this calibrating substrate 13' has not only one marking 17, but an entire marking field 18 with several markings 17', i.e., a marking matrix. The latter consists of several markings 17' arranged in the x- and y-directions at specified and known X- and Y-positions. The markings 17' of the second calibrating substrate 13' can be in particular identical to or different from the markings 17 of the first calibrating substrate 13.

It is important to mention that it is possible to perform the already-mentioned first calibration step according to FIGS. 2*a*-2*c* also with a calibrating substrate 13'. In this way, the expensive production of a calibrating substrate 13 is made unnecessary.

FIGS. 3*a*-3*f* show the steps of a process according to the invention for calibration of the first two detection units 3, 3" with one another, consequently the upper left optics and the upper right optics.

In a first calibration step according to the invention in accordance with FIG. 3*a*, the calibrating substrate 13' is loaded. The markings 17' of the marking field 18 were incorporated by a high-resolution writing process, for example an electron writing method, into the calibrating substrate 13'. The markings 17' are located in turn either on the surfaces of the calibrating substrate 13' or in the center thereof (relative to the normal direction of the calibrating substrate 13'). The markings 17' of the marking field 18 are preferably produced by photolithographic, electron-beam-lithographic or ion-beam-lithographic processes.

The advantage of the marking field 18 is comprised of the very precise and exact orientation or positioning of the different markings 17' with one another. The deviations of the markings 17' from their ideal X-position and/or Y-position are smaller than 100 µm, preferably smaller than 10 µm, more preferably smaller than 1 µm, most preferably smaller than 100 nm, and with utmost preference smaller than 10 nm. Thus, the marking field 18 represents an ideal positional chart, relative to which a calibration of a device can be performed with less positional resolution. The individual markings 17' of the marking field 18 are in particular smaller than 500×500 µm, preferably smaller than 300×300 µm, more preferably smaller than 100×100 µm, most preferably smaller than 50×50 µm, and with utmost preference smaller than 10×10 µm.

In a second calibration step according to the invention with the second calibrating substrate 13', shown in FIG. 3*b*, the latter is moved in the negative X-direction until large parts of the marking field 18, preferably the geometric midpoint of the marking field 18, are arranged in the field of vision of the left upper optics 3.

The left upper optic 3 was calibrated in the preceding calibrating process with the first calibrating substrate 13 relative to the marking 17 of the first calibrating substrate 13. The first detection unit 3 thus is located in the starting position (preferably zero point) relative to their X- and Y-positions. In contrast to the left lower optic, the left upper optic has the possibility of a movement in the X- and Y-directions.

In order to achieve a correct, quick, precise and primarily reproducible control of the X-Y-positions, all markings 17' of the marking field 18 are scanned in succession with the first detection unit 3 (left upper optics) by the center of any marking 17' of the marking field 18 being detected with the optical axis OA of the left upper optics. All positional features of the first detection unit 3, i.e., at least the X-position of the X-translational unit 8 and the Y-position of the Y-translational unit 9, preferably also the Z-position of the Z-translational unit 10, are assigned to any thus reached X-Y-position. Thus, the position of the first detection unit 3 is detected to the highly-precise values, assumed to be ideal, of the markings 17' of the marking field 18. The thus obtained values of the positions can be stored as positional charts and are used, moreover, for interpolation for the left upper optics.

In a third calibration step according to the invention with the second calibrating substrate 13', shown in FIG. 3*c*, the same process is carried out for the marking field 18 of the right side of the calibrating substrate 13' and thus the calibration of the first detection unit 3" (right upper optics).

Thus, all calibration steps for all four optics 3, 3', 3" and 3''' are completed.

The calibration is not required for each orientation process, but rather only at regular intervals or in the case of the determination of deviations during the alignment process. The determination can be carried out in particular by a metrology module.

In a first step of an embodiment of the alignment process according to the invention in accordance with FIG. 4*a*, a first substrate 14 is loaded with left and right alignment marks 17" in the alignment unit 1". In this case, the first and second detection units 3, 3', 3" and 3''' are located preferably in the Z-direction removed as far as possible from the first substrate 14 in order to simplify a loading of the first substrate 14.

In a second step of an alignment process according to the invention in accordance with FIG. 4*b*, the first substrate 14 is moved toward the left so that the left marking 17" is located in the field of vision of the second detection unit 3' (left lower optics). The left lower optics can run at the same time or immediately after in the Z-direction to the stored zero position and should thus have the marking 17" in the depth of focus area. For the case that the markings 17" are not located in the depth of focus area, the z-position of the detection unit 3' is changed in a corresponding manner around this zero point until a sharp image of the marking 17" is produced. Some corrections of the Z-position are to be performed by a method of the left lower optics 3' along the Z-direction. Since the second detection unit 3' cannot move along the X-direction and/or the Y-direction, the left marking 17" of the substrate 14 must be made to coincide by the X-translational unit 8 and/or the Y-translational unit 9 of the first (upper) holder 4 with the optical axis OA of the left lower optics 3'. After successful detection, the system stores the corresponding encoder positions of the translational and rotational units of the first holder 4, in the control system.

As the next step, an analogous step for determining the encoder positions of the translational units and rotational units of the upper holder 4 is carried out according to FIG. 4*c* relative to the right marking 17 of the first substrate 14 and the additional second detection unit 3''' (right lower optics).

In a fourth step of the alignment process according to the invention in accordance with FIG. 4*d*, a second substrate 14' is fixed on the second (lower) holder 5 and brought closer to the first substrate 14 in the Z-direction. The specimen holder was not shown in the drawings for the sake of clarity.

According to the invention, the second holder 5 has in particular only one Z-translational unit 10, so that the substrate 14' can be moved neither in the X-direction nor in the Y-direction.

Because of the preceding step, the first substrate 14 is located on the right side to the extent that the left marking 17" of the lower substrate 14' can be detected by the first detection unit 3 (upper left optics). The latter is moved in the X-direction and/or the Y-direction in order to make the left marking 17" of the second substrate 14' coincide with its optical axis or to detect the X-Y-position. Since the first detection unit 3 in the calibration step according to FIG. 3*b* was gauged/calibrated onto an ideal positional chart, the real X-Y-position of the first detection unit 3 can be determined and can be imaged to the ideal X-Y-position. The encoder positions of the X-translational unit 8 and the Y-translational unit 9 are stored and assigned to the left marking 17" of the second substrate 14'.

In a fourth step of an embodiment of an alignment process according to the invention, shown in FIG. 4*e*, the shifting of the additional first detection unit 3" is carried out to detect the right marking 17" of the second substrate 14' or to make the latter coincide with the optical axis of the right upper optics. Prior to that, the first substrate 14 is shifted toward the left in order to the give the upper right optics a free view of the right marking 17" of the second substrate 14' and to make the detection possible.

As an alternative, the detection can also be carried out from the oblique direction so that no shifting of the first substrate 14 is necessary.

After the determination of all necessary parameters, an alignment of the two substrates 14, 14', in particular without the use of optical devices such as the detection units 3, 3', 3", 3''', is carried out in a fifth step according to the invention in accordance with FIG. 4*f*. By the X-Y-positions of the first two detection units 3, 3", an X-interval of the markings 17" of the second substrate 14' in the connecting lines between the left optics and the right optics or in the optical axes of the detection pairs of the first and second detection units 3, 3', 3", 3''' is known. By the encoder positions of the first holder 4, the X-Y-positions of the markings 17" of the upper substrate 14 in the connecting lines or optical axes are known. Since the second substrate 14' is fixed in the X- and Y-directions, the calculation and then the control of the position of the upper substrate 14 are carried out so that the markings 17" of the first substrate 14 are located exactly above the corresponding markings 17" of the second substrate 14'.

In a seventh step of an alignment process according to the invention in accordance with FIG. 4g, substrates 14, 14' are ultimately brought into contact with each other, preferably exclusively by a movement of the Z-translational unit 10 of the second holder 5, in order to avoid changing the already established optimal X-Y-position of the upper substrate 14.

The two FIGS. 5a and 5b also show a diagrammatic visualization of the two basically possible calibrations of the optics 3, 3' on the marking 17.

FIG. 5a shows the optimal, in this respect faster and more economical, process of the adjustment of two optical axes. The two optical axes 3, 3' do not have any point of intersection, or the point of intersection at least does not lie within the marking 17. The optical axes cut through the subsequent bonding plane B to the left or right of the center of the marking 17. Accordingly, the marking 17 seems to be shifted in the optics 3, 3' or the correspondingly digitized sensor data. According to the invention, the distance between the holders of the alignment marks 17 is determined in order to determine an offset of the optical axes for marking 17. Thus, an absolutely precise calibration of the optical axes on one point is not necessary. The offset can be used in order to determine the exact positions for the later calibration of the two substrates.

In FIG. 5b, the optimal, but less desirable, more time-intensive and more expensive, calibration is evident, in which the point of intersection of the two optical axes of the optics 3, 3' comes to rest exactly in the marking 17. Accordingly, it is evident in the optics 3, 3' or the correspondingly digitized sensor data that the markings 17 are located precisely in the center of the digitized image.

FIGS. 6a-6c show three partial calibration steps for a cycle of a third calibrating method according to the invention for the deviation of the z-translational unit 10 along the x-y direction during the movement along the z-axis. The corresponding method is illustrated based on the left side of a calibrating substrate 13".

The calibrating substrate 13" with an upper marking 17"$o$ and a lower marking 17"$u$ is located under the left upper optics 3. The left upper optics 3 is positioned in such a way that at least the upper marking 17$o$" is focused (should the depth of focus area of the left upper optics 3 be large enough or the calibrating substrate 13" be thin enough, the lower marking 17"$u$ can also already be focused). In this position, the optics has a vertical position 5 (left scale) and a horizontal position 2.6 (lower scale). The calibrating substrate 13" is located in the vertical position 1 and the horizontal position 1.

The calibrating substrate 13" is moved to the vertical position 1.8 according to FIG. 6b and undergoes a shifting of the horizontal position from 1 to 0. In the cross-sectional visualization, only a shifting along the x-axis and the z-axis is evident. Accordingly, the calibrating substrate 13" can also still be shifted along the y-axis. By this approach of the calibrating substrate 13" to the upper optics 3, the lower marking 17$u$" comes into focus (while the upper marking 17"$o$ runs from the depth of focus area and thus is no longer focused).

The shifting in the x-direction and/or y-direction produced during the approach of the calibrating substrate 13" is stored by software. The calibrating substrate 13" remains in the vertical position 1.8 and the horizontal position 0, while the left, upper optics 3 in term focuses the upper marking 17"$o$. In this case, the upper optics 3 also adjusts its horizontal position from originally 2.6 to 1.4 in order to find the marking 17"$o$ again at the same distance from the optical axis OA, as in the first partial calibration step according to FIG. 6a. The above-described partial calibration steps can now be repeated as many times as desired in order to run over a correspondingly large distance along the z-direction and to determine the respective shifting of the z-translational unit 10 along the x-direction and/or the y-direction and to store it as a functional relationship.

FIG. 7 shows an isometric visualization of an alignment unit 1' according to the invention, in which all elements are located within the vacuum chamber 6'. In this embodiment, the substrates 13, 13', 14, 14' are loaded and unloaded via a flood-gate 19.

FIG. 8 shows a cluster 23, preferably a vacuum cluster, more preferably a high-vacuum cluster 23, wherein the embodiment 1" according to the invention is one of several modules. The substrates 13, 13', 14, 14' as well as the finished substrate stack 21 of two substrates 14, 14' that are aligned with one another are transported via a robot 22 between the different modules in order to implement different working steps.

LIST OF REFERENCE SYMBOLS

1, 1', 1" Alignment Unit
2 Support Frame
3, 3" First Detection Units
3', 3'", Second Detection Units
4 First Holder
5 Second Holder
6, 6', 6" Vacuum Chamber
7 Window
8 X-Translational Units
9 Y-Translational Units
10 Z-Translational Units
11 Phi-Rotational Units
12 Alignment Chamber
13, 13', 13" Calibrating Substrate
13$i$, 13$a$ Calibrating Substrate Surfaces
14 First Substrate
14' Second Substrate
15 Atmosphere Area
16 Vacuum Area
17, 17', 17"$o$, 17"$u$ Markings
18 Marking Field
19 Flood-Gate
20 Cover
21 Substrate Stack
22 Robot
23 Vacuum Cluster
OA Optical Axis
DOF Depth of Focus Area, English: Depth of Focus
A Distance
F Field of view (English: Field of View)
F' Area, in which a marking is preferably to stay Having described the invention, the following is claimed:

1. A method for aligning and bringing a first substrate into contact with a second substrate comprising the following steps:

fixing a first substrate to a first holder and the second substrate to a second holder, said second holder being arranged opposite to the first holder, wherein the first and second substrates are arranged between the first and second holders and disposed at a distance A between a first contact surface of the first substrate and a second contact surface of the second substrate, detecting first markings on the first substrate and second markings on the second substrate by at least four detection units, whereupon:
- at least two of said at least four detection units are first detection units that are movable in the X-direction and in the Y-direction, and
- at least two of said at least four detection units are second detection units that are movable exclusively in a Z-direction that runs crosswise to the X- and Y-directions, aligning the first substrate relative to the second substrate in an X-direction and a Y-direction running crosswise thereto by movement of the holders, and bringing into contact the contact surfaces of the aligned substrates in the Z-direction.

2. A method according to claim 1, wherein the second substrate that is fixed to the second holder can be moved exclusively in the Z-direction.

3. A method according to claim 1, wherein the aligning is carried out in a vacuum at less than 1 bar.

4. A method according to claim 1, wherein the detecting least four detection units are calibrated before the aligning, with at least one first calibrating substrate.

5. A method according to claim 4, wherein the at least one first calibrating substrate is used for calibrating optical axes of the detection units that can be arranged opposite to each other and/or for calibrating a depth of focus of the detection units relative to the at least one first calibrating substrate.

6. A method according to claim 4, wherein a second calibrating substrate is used for calibrating the first detection units relative to the movement of the first substrate to the first holder in the X-direction and in the Y-direction.

7. A method according to claim 1, wherein control and detection of movements of the substrates by means of the holders, control and detection of movement of the detection units, and control and detection of the movement of a contacting means are controlled by a control system.

8. A device for aligning and bringing a first substrate into contact with a second substrate, the device comprising:
- a first holder for fixing and moving the first substrate and a second holder for fixing and moving the second substrate, said first holder arranged opposite to said second holder, whereby the first and second substrates are alignable between the first and second holders at a distance A between a first contact surface of the first substrate and a second contact surface of the second substrate in an X-direction, a Y-direction running crosswise thereto, and a Z-direction running crosswise to the X- and Y-directions,
- at least two first detection units that are movable at least in the X-direction and in the Y-direction,
- at least two second detection units that are movable exclusively in the Z-direction,
- contacting means for bringing into contact the first substrate with the second substrate in the Z-direction, and
- a control system for controlling and detecting movements of the substrates by means of the holders, movement of the detection units, and movement of the contacting means.

9. A device according to claim 8, whereby the first holder has an X-translational unit that can move exclusively in a linear manner, a Y-translational unit that can move exclusively in a linear manner, and a Z-translational unit that can move exclusively in a linear manner.

10. A device according to claim 8, whereby the second holder has a Z-translational unit that can move exclusively in a linear manner.

11. A device according to claim 8, wherein the first detection units are arranged laterally opposite the first holder and/or the second detection units are arranged laterally opposite the second holder.

12. A device according to claim 8, wherein the first detection units have an X-translational unit that can move exclusively in a linear manner, a Y-translational unit that can move exclusively in a linear manner, and a Z-translational unit that can move exclusively in a linear manner.

13. A device according to claim 8, wherein the second detection units have a Z-translational unit that can move exclusively in a linear manner.

14. A device according to claim 8, wherein at least one of the two first detection units and at least one of the second detection units can be arranged opposite to one another.

* * * * *